(12) United States Patent
Kato et al.

(10) Patent No.: US 9,453,280 B2
(45) Date of Patent: Sep. 27, 2016

(54) FILM DEPOSITION APPARATUS, FILM DEPOSITION METHOD AND STORAGE MEDIUM

(75) Inventors: Hitoshi Kato, Iwate (JP); Katsuyuki Hishiya, Iwate (JP); Shigehiro Ushikubo, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 315 days.

(21) Appl. No.: 13/602,587

(22) Filed: Sep. 4, 2012

(65) Prior Publication Data

US 2013/0059415 A1    Mar. 7, 2013

(30) Foreign Application Priority Data

Sep. 5, 2011    (JP) .................. 2011-193046

(51) Int. Cl.
| | |
|---|---|
| H01L 21/306 | (2006.01) |
| C23C 16/00 | (2006.01) |
| C23C 16/455 | (2006.01) |
| H01J 37/32 | (2006.01) |
| C23C 16/34 | (2006.01) |

(52) U.S. Cl.
CPC ....... *C23C 16/45542* (2013.01); *C23C 16/345* (2013.01); *C23C 16/45551* (2013.01); *H01J 37/321* (2013.01); *H01J 37/32733* (2013.01)

(58) Field of Classification Search
CPC ............... H01J 37/321; H01J 37/3211; H01J 37/32119; H01J 37/32128; H01J 37/32137; H01J 37/32148; H01J 37/32155; H01J 37/32165; H01J 37/32174; H01J 37/32183; H01J 37/32733; H01J 37/32743; H01J 37/32752; H01J 37/32761; H01J 37/3277; H01J 37/32779; H01L 21/677; H01L 21/67703; H01L 21/67742

USPC .................. 118/723 I, 723 IR, 723 AN, 730; 156/345.48, 345.49, 345.55; 315/111.51

See application file for complete search history.

(56) References Cited

U.S. PATENT DOCUMENTS

| | | | | |
|---|---|---|---|---|
| 5,309,063 | A | * | 5/1994 | Singh ........................ 315/111.51 |
| 5,619,103 | A | * | 4/1997 | Tobin et al. ............. 315/111.21 |
| 6,024,826 | A | | 2/2000 | Collins et al. |
| 6,149,760 | A | * | 11/2000 | Hama ...................... 156/345.48 |

(Continued)

FOREIGN PATENT DOCUMENTS

| | | |
|---|---|---|
| CN | 1554114 | 12/2004 |
| CN | 102110572 | 6/2011 |

(Continued)

*Primary Examiner* — Luz Alejandro Mulero
(74) *Attorney, Agent, or Firm* — IPUSA, PLLC

(57) ABSTRACT

A film deposition apparatus includes a turntable having a substrate mounting area, a first plasma gas supplying part, a second plasma supplying part, a first plasma gas generating part to convert the first plasma generating gas to first plasma, and a second plasma generating part provided away from the first plasma generating part in a circumferential direction and to convert the second plasma generating gas to second plasma. The first plasma generating part includes an antenna facing the turntable so as to convert the first plasma generating gas to the first plasma, and a grounded Faraday shield between the antenna and an area where a plasma process is performed, and to include plural slits respectively extending in directions perpendicular to the antenna and arranged along an antenna extending direction to prevent an electric field from passing toward the substrate and to pass a magnetic field toward the substrate.

5 Claims, 23 Drawing Sheets

(56) References Cited

U.S. PATENT DOCUMENTS

| | | |
|---|---|---|
| 6,213,050 B1 | 4/2001 | Liu et al. |
| 6,232,236 B1 | 5/2001 | Shan et al. |
| 6,417,626 B1 | 7/2002 | Brcka et al. |
| 6,451,161 B1 * | 9/2002 | Jeng et al. ............... 156/345.48 |
| 6,869,641 B2 | 3/2005 | Schmitt |
| 6,905,625 B2 * | 6/2005 | Okumura et al. ............ 216/67 |
| 7,153,542 B2 | 12/2006 | Nguyen et al. |
| 2002/0092618 A1 | 7/2002 | Collins |
| 2004/0050329 A1 | 3/2004 | Ikeda |
| 2004/0058293 A1 | 3/2004 | Nguyen et al. |
| 2005/0022933 A1 | 2/2005 | Howard |
| 2006/0177579 A1 | 8/2006 | Shin et al. |
| 2007/0102119 A1 | 5/2007 | Ikeda |
| 2008/0026162 A1 | 1/2008 | Dickey et al. |
| 2010/0062602 A1 * | 3/2010 | Sakamoto et al. ............ 438/694 |
| 2011/0155057 A1 | 6/2011 | Kato et al. |
| 2011/0204023 A1 | 8/2011 | Huh et al. |
| 2012/0021252 A1 | 1/2012 | Lee |
| 2012/0138450 A1 | 6/2012 | Davis |
| 2012/0273130 A1 | 11/2012 | Drewery et al. |

FOREIGN PATENT DOCUMENTS

| | | |
|---|---|---|
| JP | H08-213378 | 8/1996 |
| JP | H09-008014 | 1/1997 |
| JP | 3144664 | 3/2001 |
| JP | 2007-247066 | 9/2007 |
| JP | 2007-305981 | 11/2007 |
| JP | 2008-130651 | 6/2008 |
| JP | 2008-251830 | 10/2008 |
| JP | 2010-212105 | 9/2010 |
| JP | 2010-239102 | 10/2010 |
| JP | 2010-245448 | 10/2010 |
| JP | 2011-040574 | 2/2011 |
| JP | 2011-151343 | 8/2011 |
| TW | 201126601 | 8/2011 |
| WO | 2011-069011 | 6/2011 |

* cited by examiner

FILM DEPOSITION APPARATUS, FILM DEPOSITION METHOD AND STORAGE MEDIUM

CROSS-REFERENCE TO RELATED APPLICATIONS

This patent application is based upon and claims the benefit of priority of Japanese Patent Application No. 2011-193046, filed on Sep. 5, 2011, the entire contents of which are incorporated herein by reference.

BACKGROUND OF THE INVENTION

1. Field of the Invention

The present invention relates to a film deposition apparatus, a film deposition method and a storage medium that deposit a reaction product on a surface of a substrate in a layer-by layer manner by supplying process gases that react to each other and perform a plasma process onto the substrate.

2. Description of the Related Art

An ALD (Atomic Layer Deposition) method that deposits a reaction product of plural kinds of process gases (i.e., reaction gases) that react to each other in a layer-by-layer manner on a surface of a substrate such as a semiconductor wafer (which is called a "wafer" hereinafter) by supplying the plural kinds of process gases in turn is taken as one of film deposition methods of depositing a thin film such as a silicon oxide film ($SiO_2$) and the like on the substrate. As a film deposition apparatus that performs a film deposition process by using the ALD method, for example, as disclosed in Japanese Patent Application Laid-Open Publication No. 2010-239102, an apparatus is known that allows plural wafers to be arranged on a turntable provided in a vacuum chamber and, for example, supplies respective process gases in order onto these wafers by rotating the turntable relative to plural gas supplying part arranged facing the turntable.

In the meanwhile, a wafer heating temperature (i.e., a film deposition temperature) in the ALD method is low, for example, about 300° C., compared to an ordinary CVD (Chemical Vapor Deposition) method. Because of this, if one of the process gases is, for example, an $NH_3$ (ammonia) gas and the like, this $NH_3$ gas may not be activated to the extent that a reaction product can be generated. Moreover, for example, an organic substance contained in the process gases may be taken into a thin film as impurities. Accordingly, as disclosed in Japanese Patent Application Laid-Open Publication No. 2011-40574, a technology is known that performs a plasma process with a film deposition of a thin film to activate the process gas or to reduce the impurities from the thin film.

At this time, if an interconnection structure is formed inside a wafer, there is a concern that the plasma gives electric damage to the interconnection structure. On the other hand, if a plasma source is away from the wafer to reduce the plasma damage to the wafer, because an activated species such as ions and radicals in the plasma readily become inactivated under a pressure condition of performing the film deposition process, there is a concern that it becomes difficult for the activated species to reach the wafer and a sufficient plasma process may not be implemented.

Furthermore, for example, if a depressed portion of a reverse tapered shape that has a broader opening diameter at the lower end than that at the upper end is tried to be filled up with the thin film, there may occur a void in the depressed portion, or the impurities may be taken into the thin film.

U.S. Pat. No. 7,153,542, Japanese Patent No. 3144664 and U.S. Pat. No. 6,869,641 disclose apparatuses that deposit a thin film by the ALD method, but do not disclose measures to address the above mentioned concerns.

SUMMARY OF THE INVENTION

Embodiments of the present invention provide a novel and useful film deposition apparatus, film deposition method and storage medium solving one or more of the problems discussed above.

More specifically, embodiments of the present invention provide a film deposition apparatus, a film deposition method and a storage medium that can reduce plasma damage to a substrate in laminating a reaction product on a surface of the substrate by supplying process gases that react to each other in order and performing a plasma process onto the substrate.

According to one embodiment of the present invention, there is a film deposition apparatus configured to perform a film deposition process by performing a cycle of supplying a first process gas and a second process gas in order plural times in a vacuum chamber. The film deposition apparatus includes a turntable having a substrate mounting area formed on a surface thereof to mount the substrate thereon, and configured to make the substrate mounting area revolve in the vacuum chamber, a first plasma gas supplying part configured to supply a first plasma generating gas into the chamber, a second plasma gas supplying part configured to supply a second plasma generating gas into the chamber, a first plasma generating part configured to convert the first plasma generating gas to a first plasma, and a second plasma generating part provided away from the first plasma generating part in a circumferential direction and configured to convert the second plasma generating gas to a second plasma. The first plasma generating part includes an antenna facing the surface of the turntable configured so as to convert the first plasma generating gas to the first plasma by inductive coupling, and a grounded Faraday shield having a conductive plate-like body is provided so as to intervene between the antenna and an area where a plasma process is performed, and includes plural slits respectively extending in directions perpendicular to the antenna and arranged along an antenna extending direction to prevent an electric field component of an electromagnetic field generated around the antenna from passing toward the substrate and to pass a magnetic field toward the substrate.

According to another embodiment of the present invention, there is a film deposition method of performing a film deposition process onto a substrate by performing a cycle of supplying a first process gas and a second process gas in order in a vacuum chamber. The method includes the steps of mounting a substrate on a substrate mounting area formed in a surface of a turntable provided in the vacuum chamber and making the turntable revolve, supplying a first process gas and a second process gas, respectively, to areas separated by a separating area from each other in a circumferential direction of the turntable, supplying a first plasma generating gas and a second plasma generating gas into the vacuum chamber, supplying a radio frequency power to an antenna of a first plasma generating part provided facing the surface of the turntable in order to convert the first plasma generating gas to a first plasma by inductive coupling, preventing an electric field of an electromagnetic field generated around the antenna from passing toward the substrate, and passing a magnetic field of the electromagnetic field toward the substrate by a grounded Faraday shield having a conductive plate-like body provided so as to intervene between the antenna and an area where a plasma process is performed, and to include plural slits respectively extending in directions perpendicular to the antenna and arranged along an antenna extending direction, and converting the second plasma generating gas to a second plasma in a second plasma generating part provided at a location away from the first plasma generating part in a circumferential direction of the turntable.

According to another embodiment of the present invention, there is a non-transitory computer readable storage medium used for a film deposition apparatus that deposits a thin film by repeating a cycle of supplying plural kinds of process gases in order onto a substrate in a vacuum chamber and storing a computer program. The program causes the film deposition apparatus to perform the steps of mounting a substrate on a substrate mounting area formed in a surface of a turntable provided in the vacuum chamber and making the turntable revolve, supplying a first process gas and a second process gas, respectively, to areas separated by a separating area from each other in a circumferential direction of the turntable, supplying a first plasma generating gas and a second plasma generating gas into the vacuum chamber, supplying a radio frequency power to an antenna of a first plasma generating part provided facing the surface of the turntable in order to convert the first plasma generating gas to a first plasma by inductive coupling, preventing an electric field of an electromagnetic field generated around the antenna from passing toward the substrate, and passing a magnetic field of the electromagnetic field toward the substrate by a grounded Faraday shield having a conductive plate-like body provided so as to intervene between the antenna and an area where a plasma process is performed, and to include plural slits respectively extending in directions perpendicular to the antenna and arranged along an antenna extending direction, and converting the second plasma generating gas to a second plasma in a second plasma generating part provided at a location away from the first plasma generating part in a circumferential direction of the turntable.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Figure 1:
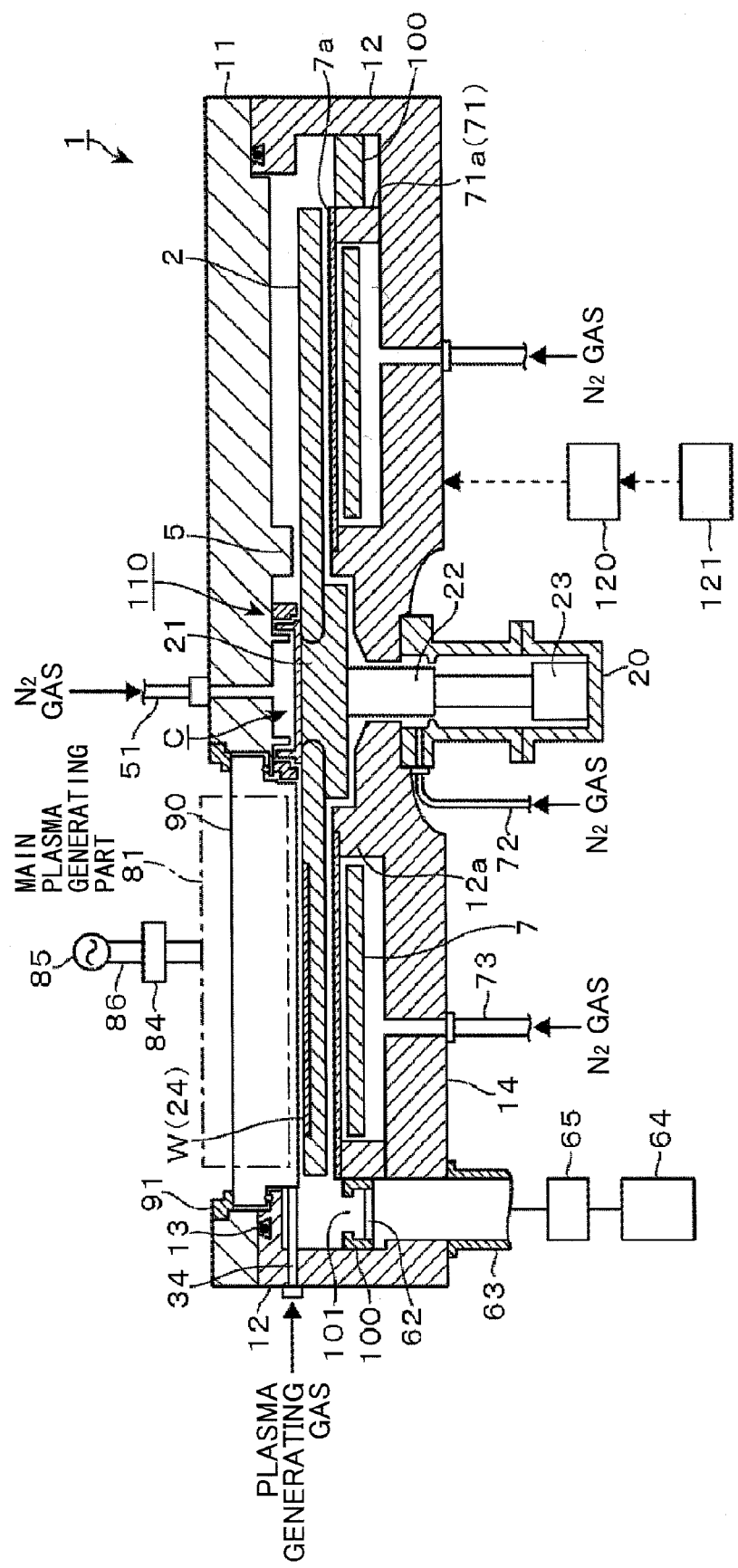
FIG. 1 is a vertical cross-sectional view showing an example of a film deposition apparatus of the present invention.
Figure 2:
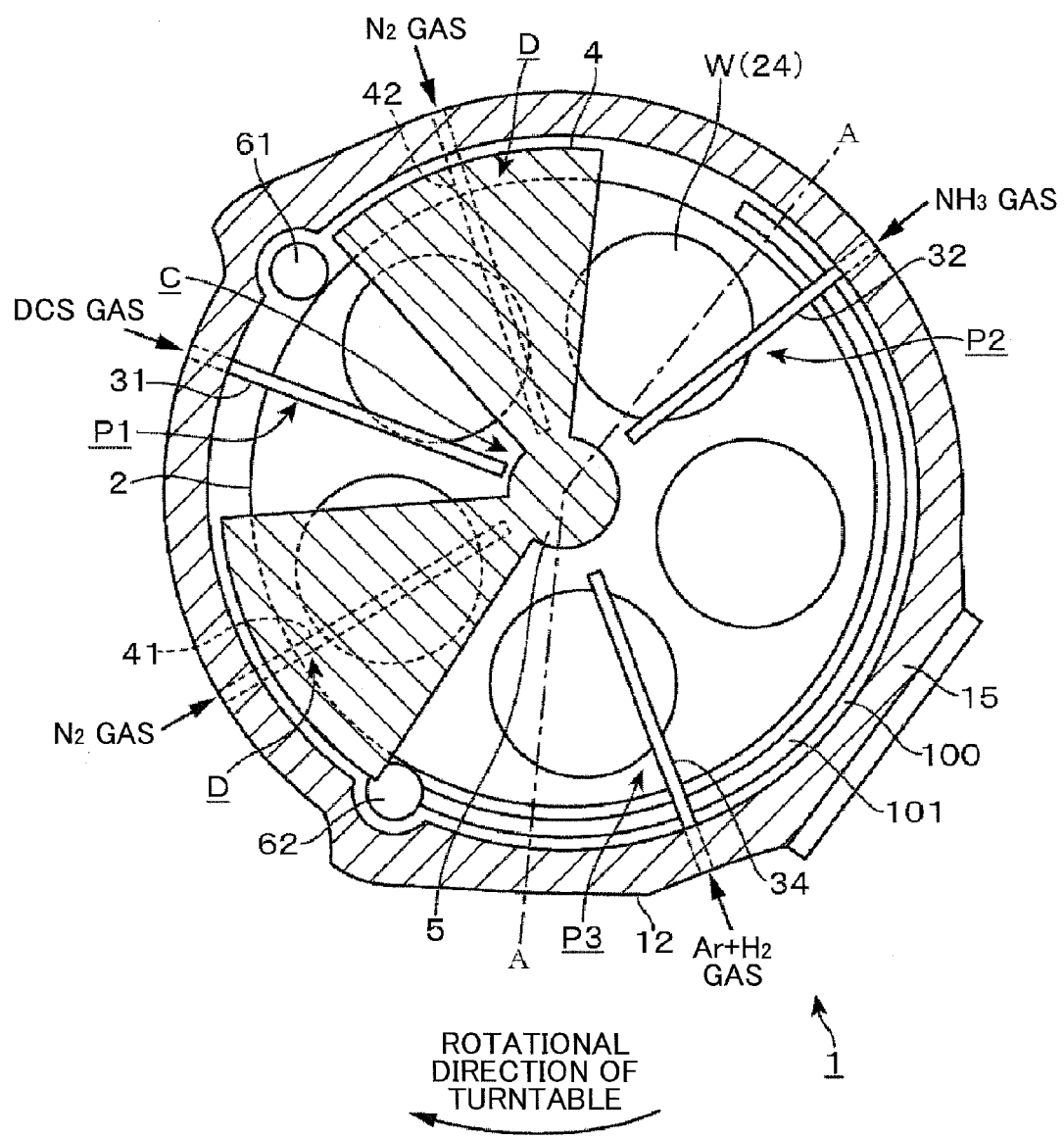
FIG. 2 is a horizontal cross-sectional view of the film deposition apparatus of the embodiment.

A description is given below, with reference to drawings of embodiments of the present invention. More specifically, a description is given about an example of a film deposition apparatus of an embodiment with reference to FIGS. 1 through 11. As shown in FIGS. 1 and 2, this film deposition apparatus includes a vacuum chamber 1 whose planar shape is an approximately round shape, and a turntable 2 provided in the vacuum chamber 1 and having the rotation center that coincides with the center of the vacuum chamber 1. As described below in detail, the film deposition apparatus is configured to deposit a thin film by laminating a reaction product on a surface of a wafer W by an ALD method, and configured to perform a plasma process onto the wafer W in the middle of depositing the thin film. At this time, in performing the plasma process, the film deposition apparatus is configured to not give electrical damage to the wafer by the plasma, or to reduce the electrical damage as much as possible. Next, a description is given about respective parts of the film deposition apparatus.

The vacuum chamber 1 includes a ceiling plate 11 and a chamber body 12, and is configured to allow the ceiling plate 11 to be detachable from the chamber body 12. A separation gas supplying pipe 51 for supplying an $N_2$ (nitrogen) gas as a separation gas is connected to the center portion on the top surface of the ceiling plate 11 in order to suppress mixture of different process gases with each other in a center area C in the vacuum chamber 1. In FIG. 1, a numeral 13 shows a seal member provided at an outer edge in the top surface of the chamber body 12 such as an O-ring.

The turntable 2 is fixed to a core part 21 having an approximately cylindrical shape at the center portion, and is configured to be rotatable around the vertical shaft, for example, in a clockwise direction by a rotational shaft 22 extending and connected to the bottom surface of the core part 21. In FIG. 1, a numeral 23 is a drive part to rotate the rotational shaft 22 around the vertical axis, and a numeral 20 is a case body to house the rotational shaft 22 and the drive part 23. A flange portion on the top side of this case body 20 is hermetically attached to a lower surface of a bottom part 14. Moreover, a purge gas supplying pipe 72 for supplying an $N_2$ gas to a lower area of the turntable 2 as a purge gas is connected to the case body 20. The outer circumference side of the core part 21 in the bottom part 14 of the vacuum chamber 1 is formed into a ring shape so as to come close to the turntable 2 from the lower side and forms as a protrusion portion 12a.

Figure 3:
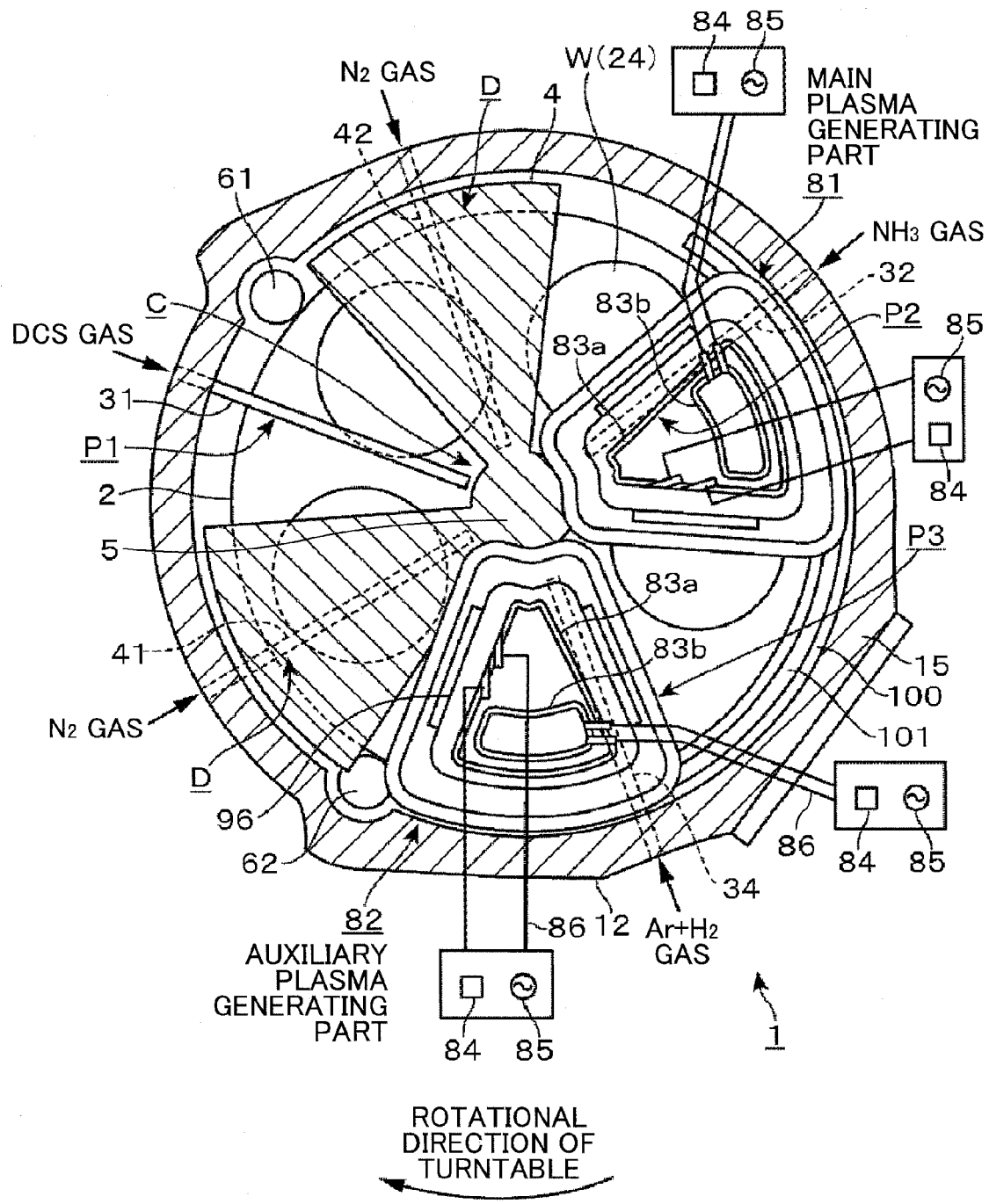
FIG. 3 is a cross-sectional plan view of the film deposition apparatus of the embodiment.

As shown in FIGS. 2 and 3, circular shaped concave portions 24 to hold the plural wafers W such as five substrates thereon, are provided along a rotational direction (a circumferential direction) as substrate loading areas. A size in diameter and depth of the concave portions 24 is set so that the surface of the wafer W and the surface of the turntable 2 (i.e., a region where the wafer W is not loaded) are even when the wafer W is dropped down (held) into the concave portion 24. In the bottom surface of the concave portion 24, three through holes are formed (which are not shown in the drawings) through which, for example, corresponding lift pins described below to move the wafer W up and down by pushing up the wafer W from the lower side pass.

As shown in FIGS. 2 and 3, at positions opposite to areas where the concave portions 24 in the turntable 2 pass through by the rotation, for example, five nozzles 31, 32, 34, 41 and 42 respectively made of quartz are arranged in a radial fashion, at intervals with each other in a circumferential direction of the vacuum chamber 1, (i.e., in a rotational direction of the turntable 2). These nozzles 31, 32, 34, 41 and 42 are, for example, respectively installed so as to extend horizontally toward the center area C from an outer peripheral wall of the vacuum chamber 1, facing the wafer W. In this example, an auxiliary plasma generating gas nozzle 34, a separation gas nozzle 41, a first process gas nozzle 31, a separation gas nozzle 42, and a main plasma generating gas nozzle 32 also used as a second process gas nozzle are arranged in this order in a clockwise fashion (i.e., in a rotational direction of the turntable 2) when seen from a transfer opening 15 described below. As shown in FIG. 3, plasma generating parts 81, 82 are respectively provided above the plasma generating gas nozzles 32, 34 in order to convert gases discharged from the gas plasma generating nozzles 32, 34 to plasma. A detailed description is given below about these plasma generating parts 81, 82. Here, FIG. 2 shows a state of the plasma generating parts 81, 82 and a casing 90 described below being removed so as to allow the plasma generating gas nozzle 32, 34 to be visible. FIG. 3 shows a state of these plasma generating parts 81, 82 and the casing 90 being attached. Moreover, FIG. 1 shows a vertical cross-sectional view of the film deposition apparatus along the A-A line in FIG. 2.

In FIG. 2, the first process gas nozzle 31 forms a first process gas supplying part, and the main plasma generating gas nozzle 32 forms a second process gas supplying part and a main plasma generating gas supplying part. The auxiliary plasma generating gas nozzle 34 forms an auxiliary plasma generating gas supplying part. Furthermore, the separation gas nozzles 41, 42 respectively form separation gas supplying part. Here in FIG. 1, the plasma generating part 81 is shown by alternate long and short dash line in a schematic way.

The nozzles 31, 32, 34, 41 and 42 are respectively connected to gas supplying sources (which are not shown in the drawing) through flow control valves. More specifically, the first process gas nozzle 31 is connected to a source of a first process gas containing Si (silicon) such as a DCS (dichlorosilane) gas. The main plasma generating gas nozzle 32 is connected to a source of a second process gas and a main plasma generating gas such as an $NH_3$ (ammonia) gas. The auxiliary plasma generating gas nozzle 34 is connected to a source of an auxiliary plasma generating gas such as a mixed gas of an Ar (argon) gas and a $H_2$ (hydrogen) gas. The separation gas nozzles 41, 42 are respectively connected to a source of an $N_2$ (nitrogen) gas to be a separation gas. Incidentally, while the $NH_3$ gas is used as the main plasma generating gas in this embodiment, a mixed gas of the $NH_3$ gas and the Ar gas may be used as the main plasma generating gas in other embodiments.

Figure 5:
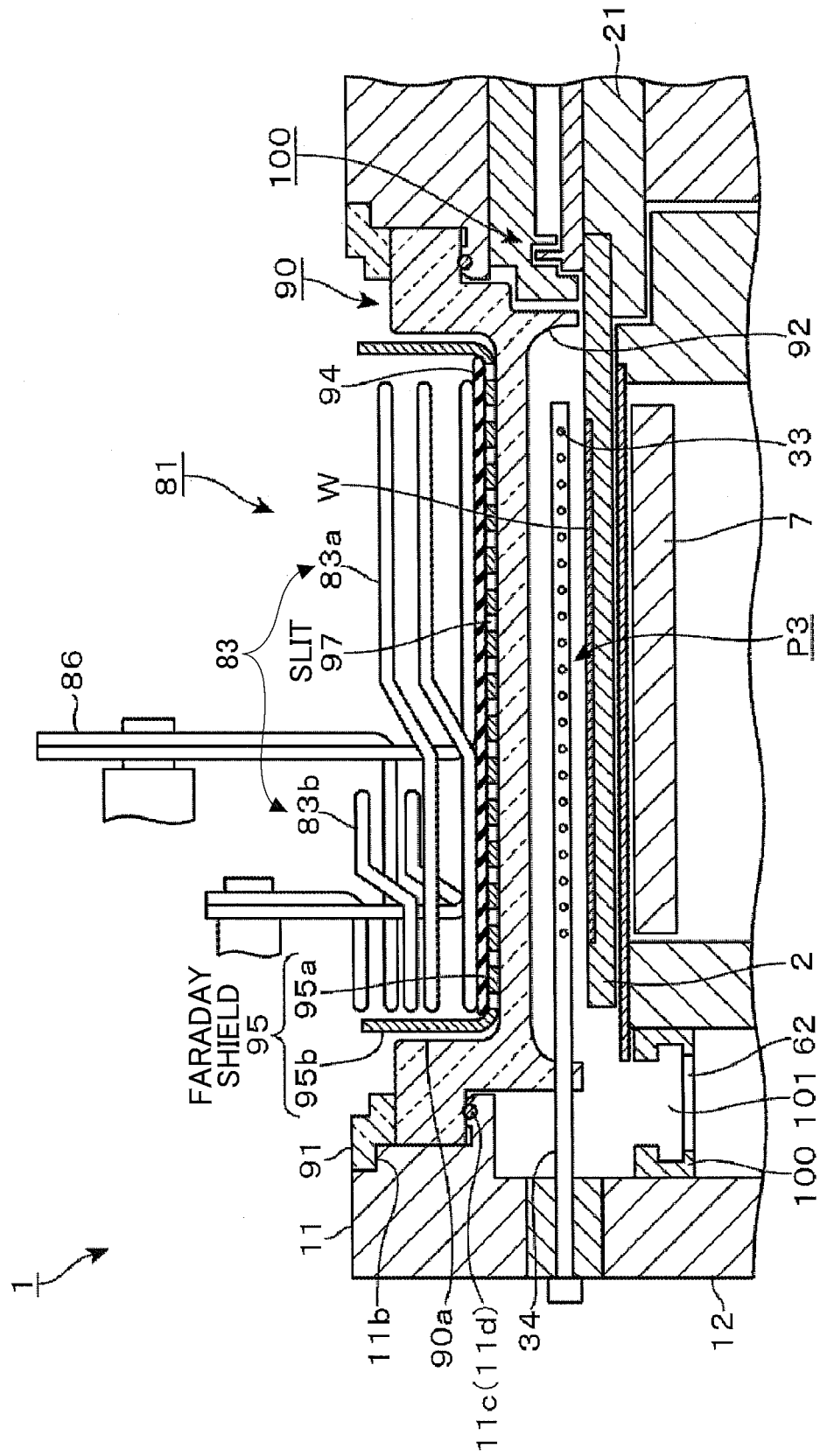
FIG. 5 is a vertical cross-sectional view showing a part of an inside of the film deposition apparatus of the embodiment.
Figure 7:
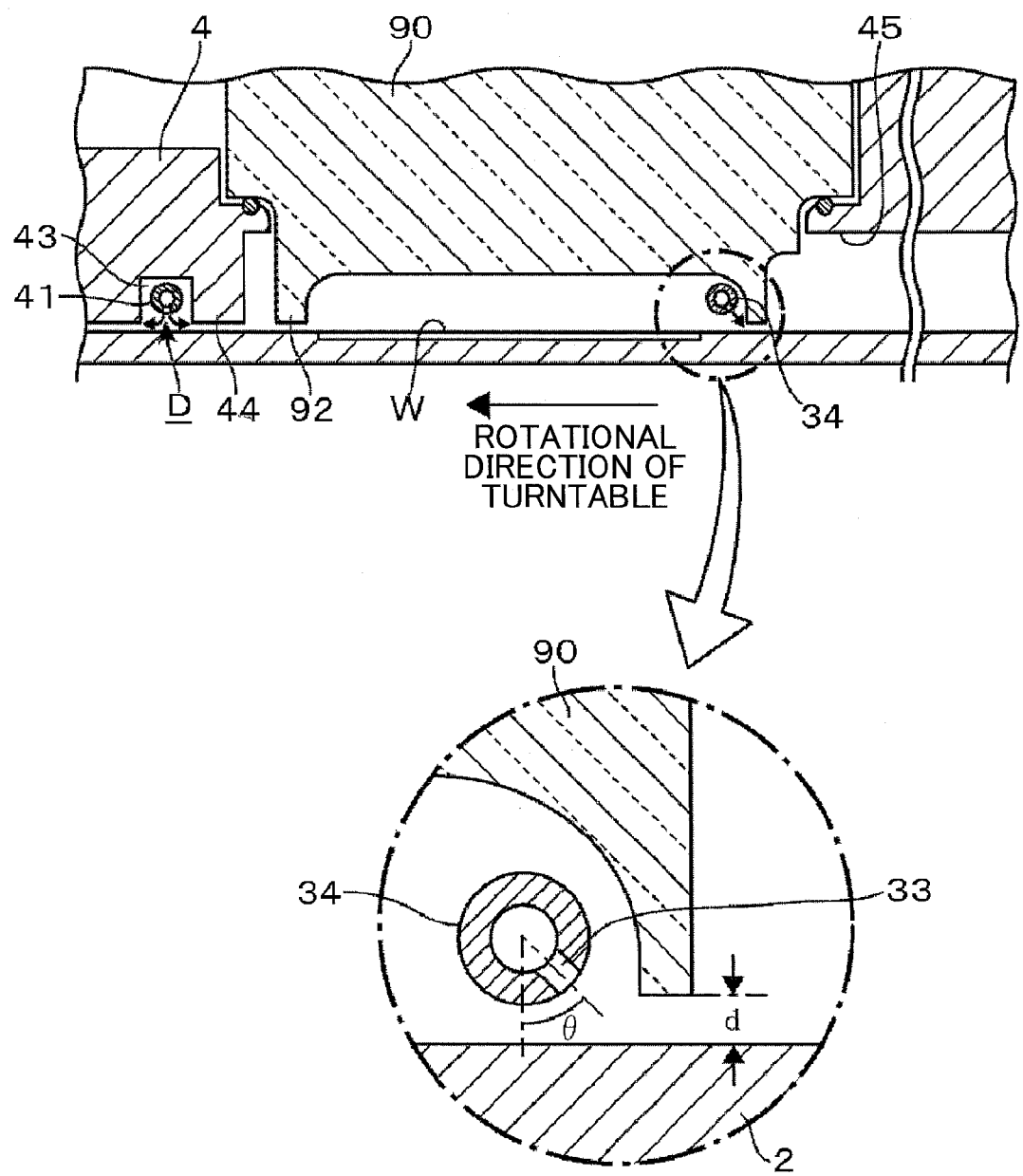
FIG. 7 is a vertical cross-sectional view showing a part of an inside of the film deposition apparatus of the embodiment.

As shown in FIGS. 5 and 7, in the lower surface of the gas nozzles 31, 32, 34, 41 and 42, gas discharge ports 33 are formed at plural points along a radial direction of the turntable 2, for example, at an equal distance. In the circumference surface of the plasma generating nozzles 32, 34, the gas discharge ports 33 are formed at plural points along a length direction of the plasma generating gas nozzles 32, 34, for example, at an equal distance so as to respectively face the upstream in the rotational direction of the turntable 2 and downward (obliquely downward). The reason why the gas discharge ports 33 of the plasma generating gas nozzles 32, 34 are set at such a direction is described below. These respective nozzles 31, 32, 34, 41 and 42 are arranged so that a distance between the lower end edge of the nozzles 31, 32, 34, 41 and 42 and the top surface of the turntable 2 is, for example, about 1 to 5 mm.

An area under the process gas nozzle 31 is a first processing area P1 to adsorb the Si-containing gas onto the wafer W, and an area under the main plasma generating gas nozzle 32 is a second process area P2 to react the Si-containing gas adsorbed on the wafer W with the plasma of the $NH_3$ gas. In addition, an area under the auxiliary plasma generating gas nozzle 34 becomes a third process area P3 to perform a chemical alteration process (which may be just called "an alteration process" hereinafter) onto a reaction product formed on the wafer W by passing through the process areas P1, P2. The separation gas nozzles 41, 42 are to form separating areas D that separate the first process area P1 from the third process area P3 and the second process area P2 respectively. On the ceiling plate of the vacuum chamber 1 in the separating areas D, as shown in FIGS. 2 and 3, approximately sector convex portions 4 are provided, and the separation gas nozzles 41, 42 are held in groove portions 43 formed in the convex portions 4 as shown in FIG. 7 (only the separation gas nozzle 41 is shown in the drawing). Accordingly, on the both sides of the separation gas nozzles 41, 42 in the circumferential direction of the turntable 2, low ceiling surfaces (first ceiling surfaces) to be bottom surfaces of the convex portions 4 are arranged to prevent the respective process gases from mixing with each other, and on the both sides of these ceiling surfaces 44 in the circumferential direction, ceiling surfaces 45 (second ceiling surfaces) higher than the ceiling surfaces 44 are arranged. The periphery of the convex portions 4 (i.e., a part of the convex portions 4, the part being on the outer edge side of the vacuum chamber 1) is bent into a L letter so that the bent part faces the outer edge surface of the turntable 2 and is slightly distanced from the chamber body 12, thereby preventing the process gases from being intermixed with each other.

Figure 4:
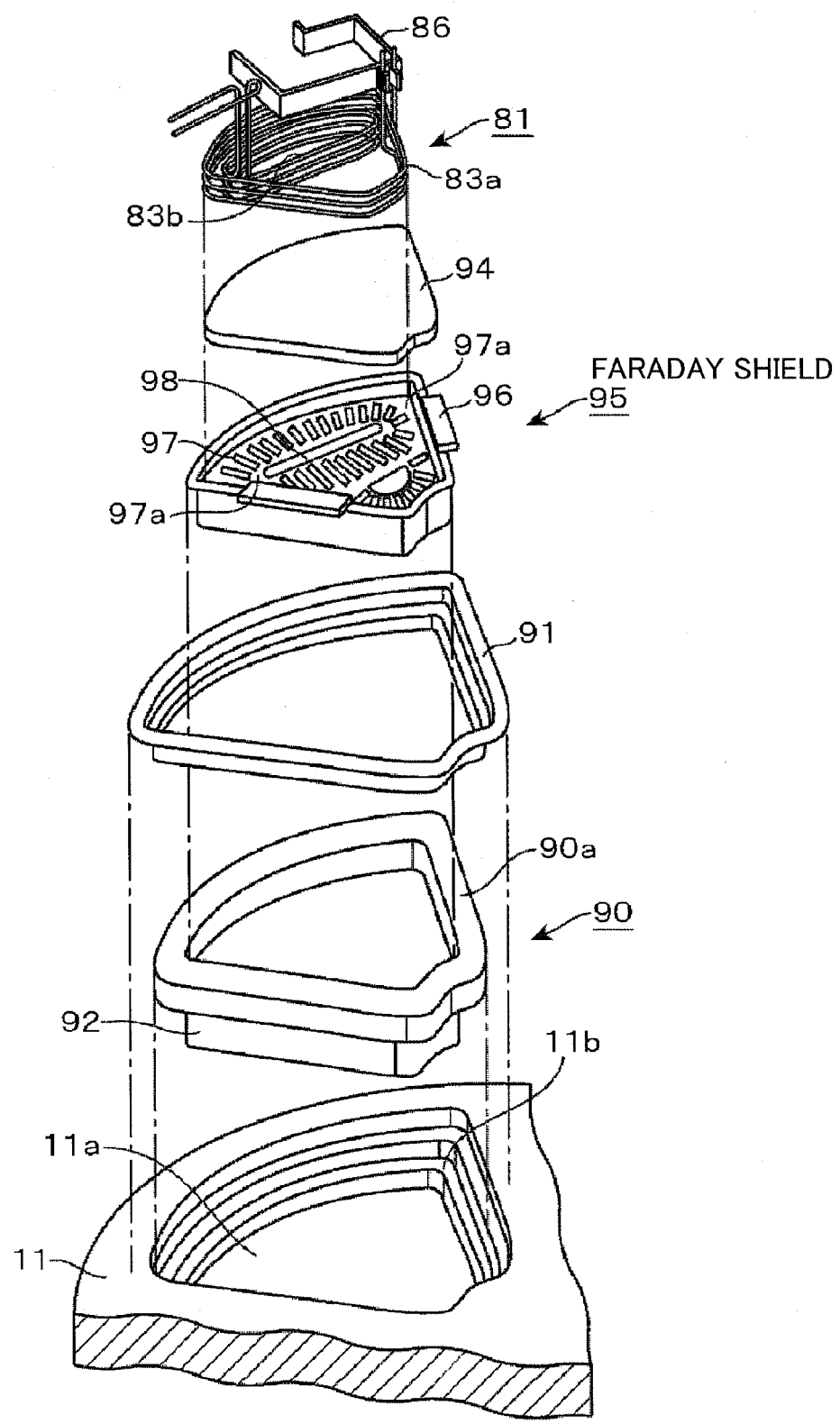
FIG. 4 is an exploded perspective view showing a part of an inside of the film deposition apparatus of the embodiment.

Next, a description is given about the main plasma generating part 81 and the auxiliary plasma generating part 82. To begin with, the description is given about the main plasma generating part 81. The main plasma generating part 81 is provided on the right side, as seen from the transfer opening 15 (i.e., the upstream in the rotational direction of the turntable 2), as discussed above, and is configured to have an antenna 83 made of a metal wire that is wound in a coiled form. In this example, the antennas 83 are, for example, made of a material of copper (Cu) plated with nickel and gold in this order. Moreover, the antennas 83 are provided on the ceiling plate 11 of the vacuum chamber 1 so as to be sectioned hermetically from the inner area of the vacuum chamber 1. Concretely, as shown in FIGS. 3 and 4, in the ceiling plate 11 above the main plasma generating gas nozzle 32 (specifically, from a slight upstream location of the nozzle 32 in the rotational direction of the turntable 2 to a location slightly closer to the nozzle 32 than the transfer opening 15), an opening portion 11a that opens in an approximately sector, as seen from a planar perspective, is formed. Here, the plasma generating parts 81, 82 are described by respectively putting a term of "main" and "auxiliary" to avoid confusion, but the plasma generating parts 81, 82 have a configuration similar to each other, and plasma processes respectively performed by the plasma generating parts 81, 82 are independent from each other.

The opening portion 11a is formed from a location about 60 mm away from the rotation center of the turntable 2 toward the outer edge to a location about 80 mm outside the outer edge of the turntable 2. Furthermore, the opening portion 11a is depressed in an arc-shaped form so that an inner edge of the turntable 2 lies along the outer edge of a labyrinth structure portion 110 when seen from a planar perspective, and so as not to interfere with (to avoid) the labyrinth structure portion 110 (described below) provided in the center area C of the vacuum chamber 1. The opening portion 11a, as shown in FIGS. 4 and 5, is formed so that an opening diameter of the opening portion 11a decreases in stages from the top end surface of the ceiling plate 11 toward the bottom end surface, for example, including three step portions 11b formed along through the circumferential direction in the inner periphery. Among these step portions 11b, on the top surface of the lowest step portion 11b (i.e., opening edge portion), as shown in FIG. 5, a groove 11c is formed along through the circumferential direction, and a seal member, for example, an O-ring 11d is installed in the groove 11c. Here in FIG. 4, the groove 11c and the O-ring 11d are omitted, and the ceiling plate 11 is cut off.

Figure 6:
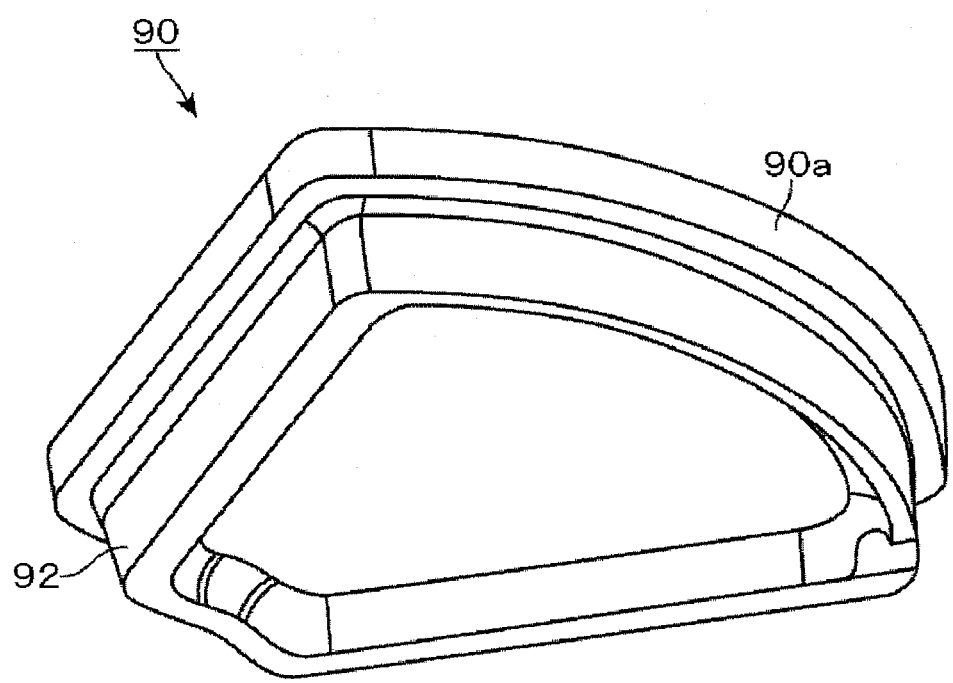
FIG. 6 is a perspective view showing a part of an inside of the film deposition apparatus of the embodiment.
Figure 9:
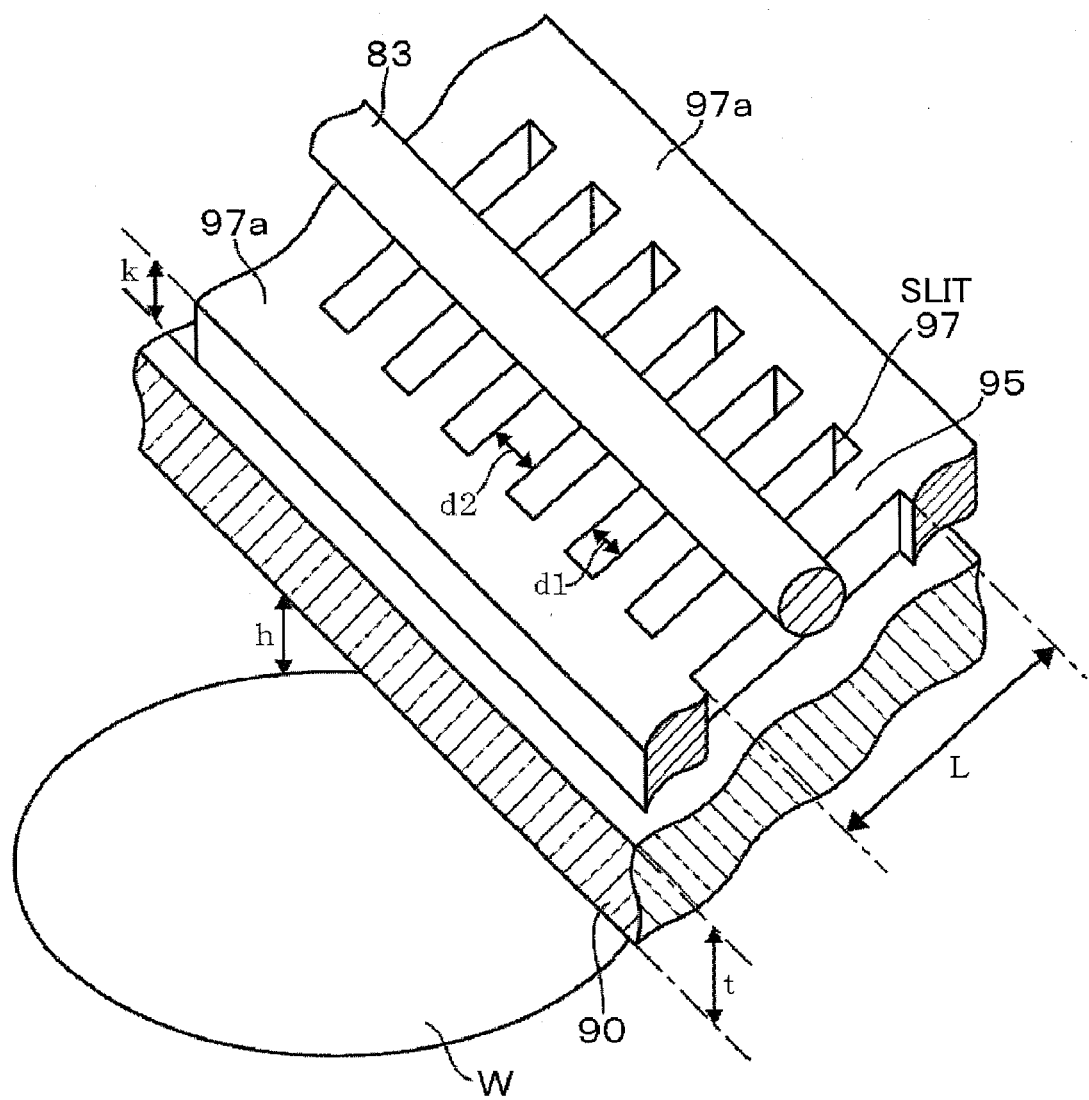
FIG. 9 is a perspective view showing a part of a Faraday shield of the film deposition apparatus of the embodiment.

As shown in FIGS. 4, 6 and 1, in this opening portion 11a, the casing 90 is provided whose peripheral portion on the upper side horizontally extends outward along through a circumferential direction in a flanged shape to form a flange portion 90a, and middle portion is formed to be hollow inward and toward the inner area of the vacuum chamber 1 on the lower side. This casing 90 is configured to be permeable (i.e., transmits a magnetic field) made of a dielectric material such as a quartz and the like to allow a magnetic field generated by the main plasma generating part 81 to pass toward the wafer W side, as shown in FIG. 9. A thickness t of the hollow portion is, for example, 20 mm. In addition, the casing 90 is configured so that a distance between the inner wall surface of the casing 90 on the center area C side and the outer edge of the wafer W is 70 mm and the inner wall surface of the casing 90 on the peripheral side of the turntable 2 and the outer edge of the wafer W is 70 mm where the wafer W is located below the casing 90.

When this casing 90 is dropped into the opening portion 11a, the flange portion 90a and the lowest step portion 11b among the step portions 11b are locked together. Then, the step portion 11b (i.e., ceiling plate 11) is hermetically connected to the casing 90 by the O-ring 11d. Moreover, by allowing a pressing member 91 formed into a frame shape along the outer edge of the opening part 11a to press the flange portion 90a downward along the circumferential direction, and by fixing the pressing member 91 to the ceiling plate 11 by a bolt and the like (not shown in the drawings), an inner atmosphere of the vacuum chamber 1 is set in a hermetically-sealed manner. In this way, a distance h (see FIG. 9) between the lower surface of the casing 90 and the top surface of the wafer W on the turntable 2 is 4 to 60 mm, and 30 mm in this example when the casing 90 is hermetically fixed to the ceiling plate 11. Here, FIG. 6 shows a view of the casing 90, as seen from the lower side.

As shown in FIGS. 5 through 7, the lower surface of the casing 90 includes an outer edge portion vertically extending downward through the circumferential direction and forming a protruding portion 92 for gas regulation to prevent the $N_2$ gas intruding into the lower area of the casing 90. Then, in an area surrounded by the inner periphery of the protruding portion 92, the lower surface of the casing 90 and the top surface of the turntable 2, the main plasma generating gas nozzle 32 is held on the upstream side in the rotational direction of the turntable 2.

The protruding portion 92 on the base end portion side (i.e., side wall side of the vacuum chamber 1) of the main plasma generating gas nozzle 32 is cut off so as to lie along the outer shape of the plasma generating gas nozzle 34 in an approximately arc-shaped form. A distance d between the lower surface of the protruding portion 92 and the top surface of the turntable 2 is 0.5 to 5 mm, 2 mm in this example. Sizes in width and height of the protruding portion 92 are respectively, for example, 10 mm and 28 mm. Here, FIG. 7 shows a vertical cross-sectional view of the vacuum chamber 1 along the rotational direction of the turntable 2.

Furthermore, because the turntable 2 rotates in a clockwise direction during a film deposition process, the $N_2$ gas is likely to intrude into the lower side of the casing 90 from a gap between the turntable 2 and the protruding portion 92 by being induced by the rotation of the turntable 2. Because of this, to prevent the $N_2$ gas intruding to the lower side of the casing 90 through the gap, a gas is discharged from the lower side of the casing 90 to the gap. More specifically, as shown in FIGS. 5 and 7, the gas discharge port 33 of the main plasma generating nozzle 32 is arranged so as to face the gap, that is to say, so as to face the upstream side in the rotational direction of the turntable 2 and downward. A facing angle θ (theta) of the gas discharge port 33 of the main plasma generating nozzle 32 relative to the vertical axis is, for example, about 45 degrees as shown in FIG. 7.

Here, when the O-ring 11d that seals an area between the ceiling plate 11 and the casing 90 is seen from the lower side of the casing 90 (i.e., the second process area P2), as shown in FIG. 5, the protruding portion 92 is formed along the circumferential direction. Due to this, the O-ring 11d can be said to be distanced from the second process area P2 not to be exposed to the plasma. Accordingly, even if the plasma is going to diffuse, for example, from the second process area P2 to the O-ring 11d side, because the plasma has to go through a region under the protruding portion 92, the plasma is led to be deactivated before arriving at the O-ring 11d.

Inside the casing 90, a grounded Faraday shield 95 is housed that is made of a metal plate to be a conductive plate-like body having a thickness k, for example, about 1 mm, and is formed to approximately lie along the inner shape of the casing 90. In this example, the Faraday shield 95 is, for example, made of a plate material formed by plating a nickel (Ni) film and a gold (Au) film on a copper (Cu) plate from the lower side. In other words, this Faraday shield 95 includes a horizontal plane surface 95a horizontally formed so as to fit the bottom surface of the casing 90 and a vertical plane surface 95b that extends upward from the outer edge along the circumferential direction, and is configured to have an approximately sector shape along the inner edge of the casing 90 when seen from the upper side. This Faraday shield 95 is formed, for example, by a strip process of a metal plate, or by bending an area corresponding to the outside of the horizontal plane surface 95a in a metal plate.

In addition, as shown in FIG. 4, top end edges of the Faraday shield 95 on the right and left sides when the Faraday shield 95 is seen from the rotation center of the turntable 2, horizontally extend rightward and leftward respectively, and form supporting portions 96. Then, when the Faraday shield 95 is put in the casing 90, the lower surface of the Faraday shield 95 and the top surface of the casing 90 contact with each other, and the supporting portions 96 are supported by the flange portion 90a of the casing 90. An insulating plate 94, for example, made of quartz and about 2 mm thick is stacked on the horizontal plane 95a to isolate the main plasma generating part 81 mounted on the Faraday shield 95. Plural slits 97 are formed in the horizontal plane surface 95a, but a shape and a layout arrangement about the slits 97 are described below with a shape of the antenna 83 of the main plasma generating part 81. However, with respect to the insulating plate 94, drawings are omitted in FIGS. 8 and 9 described below.

The main plasma generating part 81 is configured to be put in the Faraday shield 95. Accordingly, as shown in FIGS. 4 and 5, the main plasma generating part 81 is arranged to face toward the inside of the vacuum chamber 1 (i.e., the wafer W on the turntable 2) through the casing 90, the Faraday shield 95, and the insulating plate 94. The main plasma generating part 81 is configured to have the antenna 83 that is wound around the vertical axis, for example, three times as shown in FIG. 4, and two antennas 83a, 83b are provided in this example. Among the two antennas 83a, 83b, if one is called a first antenna 83a and the other is called a second antenna 83b, as shown in FIGS. 4 and 5, the first antenna 83a has an approximately sector shape along the inner edge of the casing 90 when seen from a planar perspective. Moreover, the first antenna 83a is arranged so as to allow the edges on the center area C side and the outer circumference side to be close to the inner wall surface of the casing 90 to be able to emit (supply) the plasma to the whole area between the edges on the center area C side in the wafer W and the outer circumference side when the wafer W is located under the first antenna 83a. Here, flow passages through which cooling water flows are respectively formed inside the antennas 83a, 83b, but are omitted here.

As shown in FIG. 3, the second antenna 83b is arranged between a location about 200 mm away from the center position of the wafer W on the turntable 2 toward the outer circumference and a location about 90 mm away from the outer edge of the turntable 2 toward the outer circumference to be able to supply the plasma to the wafer W on the outer circumference side in the radial direction of the turntable 2. In other words, when the turntable 2 rotates, the circumferential speed is faster on the outer circumference side than on the center side. This may cause an amount of plasma supplied to the wafer W to be less on the outer circumferential side than on the inner circumferential side. Thus, to make the amount of plasma supplied to the wafer W uniform in the radial direction of the turntable 2, in other words, to compensate the amount of plasma supplied to the wafer W by the antenna 83a, the second antenna 83b is provided.

The first antenna 83a and the second antenna 83b are individually connected to radio frequency power sources 85, for example, having a frequency of 14.56 MHz and an output power of 5000 W through matching boxes 84, respectively, which are configured to be able to adjust radio frequency power for the first antenna 83a and the second antenna 83b independently. Here, numerals 86 in FIGS. 1, 3 and 4 mean connection electrodes to connect the respective antennas 83a, 83b to the matching boxes 84 and the radio frequency power sources 85 electrically.

Here, a description is given about the slits 97 of the Faraday shield 95. Among an electric field and a magnetic field (an electromagnetic field) that the respective antennas 83a, 83b generate, these slits 97 are to prevent an electric field component from heading for the wafer W located below, and to bring the magnetic field to the wafer W. More specifically, if the electric field reaches the wafer W, the electric interconnection formed inside the wafer W may suffer electrical damage. On the other hand, because the Faraday shield 95 is made of the grounded metal plate as mentioned above, the Faraday shield 95 may block off the magnetic field as well as the electric field if the slits 97 are not formed. Moreover, if a large opening is formed under the antenna 83, not only the magnetic field but also the electric field passes. Hence, to block off the electric field and to pass the magnetic field, slits 97 whose size and layout arrangement are set as follows are formed.

Figure 8:
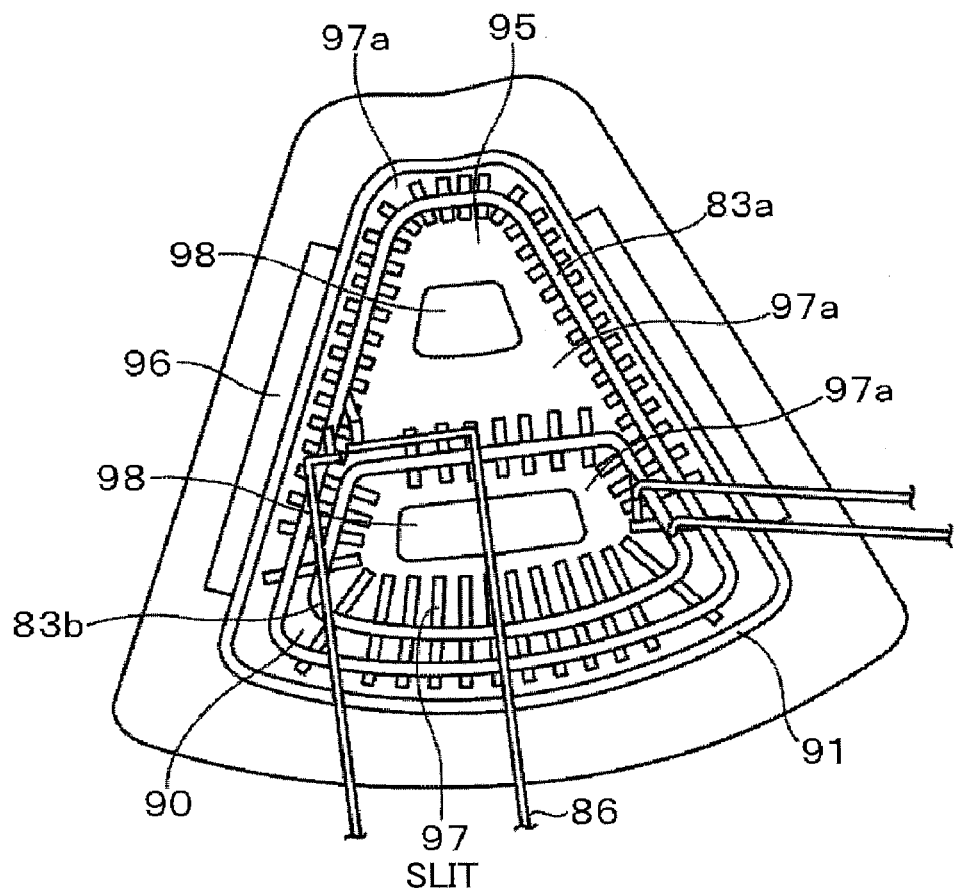
FIG. 8 is a plan view showing a part of an inside of the film deposition apparatus of the embodiment.

More specifically, as shown in FIG. 8, the slits 97 are respectively formed located below the antennas 83a, 83b along the circumferential direction so as to extend in directions perpendicular to respective winding directions of the first antenna 83a and the second antenna 83b. Accordingly, for example, in an area where the antennas 83a, 83b are arranged along the radial direction of the turntable 2, the slits 97 are formed in a linear or arc-like fashion along a tangential or circumferential direction of the turntable 2. Furthermore, in an area where the antennas 83a, 83b are arranged in an arc-like fashion so as to lie along the outer edge of the turntable 2, the slits 97 are formed linearly in a direction heading from the rotation center of the turntable 2 to the outer edge. Then, at portions where the antennas 83a, 83b bend between the above-mentioned two locations, the slits 97 are respectively formed in angled directions relative to the circumferential direction and the radial direction of the turntable 2 so as to be perpendicular to extending directions of the antennas 83a, 83b at the bending portions. Hence, many slits 97 are arranged along the extending directions of the respective antennas 83a, 83b.

Here, the radio frequency power sources 85 having a frequency of 13.56 MHz are connected to the antennas 83a, 83b as discussed above, and a wavelength corresponding to this frequency is 22 m. Because of this, as shown in FIG. 9, in order to be a width dimension of about not more than $\frac{1}{10000}$ of this wavelength, the slits 97 are formed to have a width d1 in a range from 1 to 5 mm, 2 mm in this example, and to have a distance between the slits 97 d2 in a range from 1 to 5 mm, 2 mm in this example. Moreover, as shown in FIG. 8, when seen from a direction where the antenna 83a (83b) extends, the slits 97 are formed from a point about 30 mm away rightward from the right edge of the antenna 83a (83b) to a point about 30 mm away leftward from the left edge of the antenna 83a (83b). Accordingly, it can be said that conducting paths 97a, 97a made of a grounded conductive body are respectively arranged along the circumferential direction so as to block off the opening end of the slits 97 on the one end and the other end in the length direction of the respective slits 97.

In the Faraday shield 95, in an area other than the area in which these slits 97 are formed, that is to say, in the center side of the area where the antennas 83a, 83b are wound around, openings 98 to check an emitting state of the plasma through the area are respectively formed. Here in FIG. 3, the slits 97 are omitted. Furthermore, in FIGS. 4, 5 and the like, the slits 97 are simplified, but for example, about 150 slits 97 are formed. The slits 97 are formed to increase in the width d1 with increasing the distance from an area close to the opening 98 toward an area far from the opening 98, but the drawing of the increase is omitted here.

The auxiliary plasma generating part 82 is arranged to be distanced from the main plasma generating part 81 toward the downstream in the rotation direction of the turntable 2. The auxiliary plasma generating part 82 has a configuration similar to the main plasma generating part 81. In other words, the auxiliary plasma generating part 82 includes the first antennas 83a and the second antennas 83b, and is arranged above the casing 90, the Faraday shield 96 and the insulating plate 94. Similarly to the main plasma generating part 81, the antennas 83a, 83b of the auxiliary plasma generating part 82 are individually connected to the radio frequency power source 85 having a frequency, for example, of 13.56 MHz and an output power, for example, of 5000 W through the matching boxes 84, and are configured to supply the radio frequency power to the first antennas 83a and the second antennas 83b individually.

Figure 10:
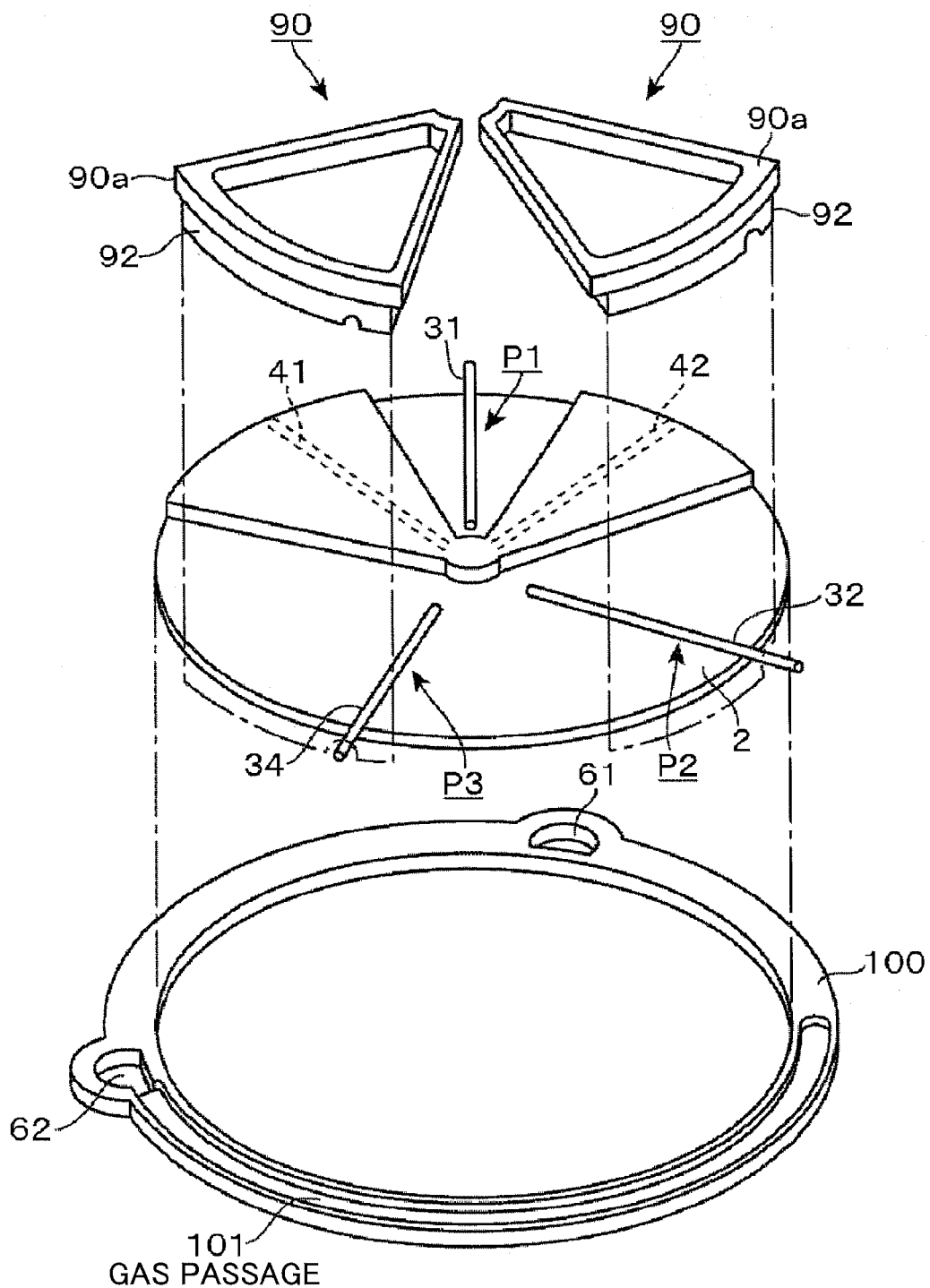
FIG. 10 is an exploded perspective view showing a side ring of the film deposition apparatus of the embodiment.

Next, respective parts of the vacuum chamber 1 are additionally described. As shown in FIGS. 2, 5 and 10, a side ring 100 to be a cover body is arranged on the outer circumferential side of the turntable 2 and slightly below the turntable 2. This side ring 100 is, for example, used in cleaning the film deposition apparatus, when a fluorine-system cleaning gas is used instead of respective process gasses, to protect the inner wall of the vacuum chamber 1 from the cleaning gas. In other words, it can be said that a concave air flow passage that can form an air flow (exhaust flow) in a transverse direction is formed in a ring shape along the circumferential direction between the outer circumferential portion of the turntable 2 and the inner wall of the vacuum chamber 1 if the side ring 100 is not provided. Because of this, the side ring 100 is provided in the air flow passage in order to minimize exposure of the inner wall of the vacuum chamber 1 to the air flow passage. In this example, an area on the outer edge side of the respective separating areas D and the casings 90 are located above the side ring 100.

In the top surface of the side ring 100, evacuation openings 61, 62 are formed at two places so as to be away from each other in the circumferential direction. In other words, the two evacuation ports are formed below the air flow passage, and the evacuation openings 61, 62 are formed at places corresponding to the evacuation ports in the side ring 100. Among the two evacuation openings 61, 62, if one and the other are respectively called a first evacuation opening 61 and a second evacuation opening 62, the first evacuation opening 61 is formed, between the first process gas nozzle 31 and the separating area D on the downstream side in the rotational direction of the turntable 2 relative to the first process gas nozzle 31, at a location closer to the separating area D side. The second evacuation opening 62 is formed, between the auxiliary plasma generating gas nozzle 34 and the separating area D on the downstream side in the rotational direction of the turntable 2 relative to the auxiliary plasma generating gas nozzle 34, at a location closer to the separating area D side. The first evacuation opening 61 is to evacuate the Si-containing gas and the separation gas, and the second evacuation opening 62 is to evacuate the plasma generating gas supplied from the auxiliary plasma generating gas nozzle 34 as well as the NH$_3$ gas and the separation gas. These first evacuation opening 61 and the second evacuation opening 62 are, as shown FIG. 1, connected to, for example, a vacuum pump 64 to be a vacuum evacuation mechanism.

Here, as discussed above, because the casing 90 is formed from the center area C to the outer edge side, for example, with respect to the separation gas discharged to the upstream side in the rotational direction of the turntable 2 relative to the main plasma generating part 81, a gas flow heading for the second evacuation opening 62 is regulated by the casing 90. Moreover, with respect to the auxiliary plasma generating part 82, since the casing 90 is formed from the center area C side to the outer edge side, a gas flow heading from the upstream of the casing 90 to the second evacuation opening 62 is regulated. Accordingly, a groove-like gas passage 101 to flow the separation gas is formed on the top surface of the side ring 100 in the outer side of the casing 90. More specifically, as shown in FIG. 3, the gas passage 101 is formed into an arc-like shape from a location that is, for example, about 60 mm closer to the first evacuation opening 61 than the upstream end in the rotational direction of the turntable 2 of the main plasma generating part 81 in the casing 90 to the second evacuation opening 62 so as to be, for example, about 30 mm deep. Hence, the gas passage 101 is formed to be along the outer circumference of the casing 90 and to lie across the casing 90 of the main plasma generating part 81 and the auxiliary plasma generating part 82 and the outer edge of the casing 90. This side ring 100 is omitted to be shown in the drawing, but its surface is coated with, for example, alumina and the like, or covered with a quartz cover to resist corrosion against the fluorine system gas.

As shown in FIG. 2, in the center portion under the lower surface of the ceiling plate 11, a protrusion portion 5 is provided that is formed in an approximately ring shape through in the circumferential direction from a portion on the center area C side in the convex portion 4 and whose lower surface is formed in the same height as the lower surface of the convex portion 4 (ceiling surface 44). As shown in FIG. 1, over the core portion 21 on the rotation center side of the turntable 2 relative to the protrusion portion 5, the labyrinth structure 110 is arranged to prevent the Si-containing gas and the NH$_3$ gas and the like from being mixed with each other in the center area C. In other words, as noted in FIG. 1, because the casing 90 is formed up to a position close to the center area C, the core portion 21 that supports the center portion of the turntable 2 is formed in a position close to the rotation center side so as to allow the upper side portion of the turntable 2 to avoid the casing 90. Accordingly, in the center area C side, for example, the process gases are likely to mix with each other compared to the outer edge side. Therefore, by forming the labyrinth structure 110, which limits a flow passage of the gas, mixing the process gases with each other is prevented.

Figure 11:
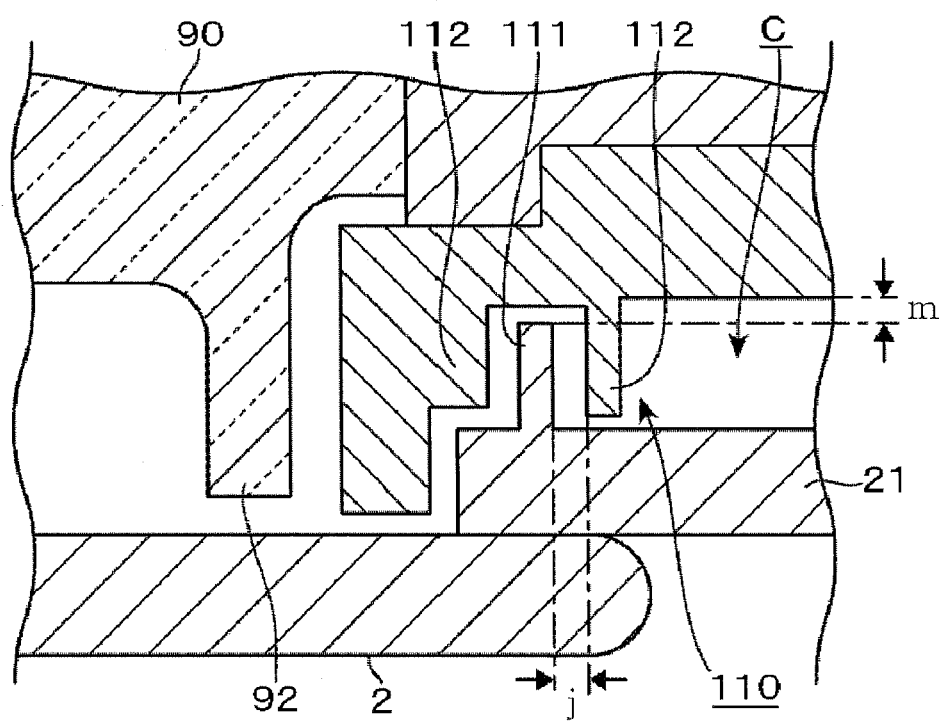
FIG. 11 is a vertical cross-sectional view showing a part of a labyrinth structure portion of the film deposition apparatus of the embodiment.

More specifically, the labyrinth structure 110, as the labyrinth structure 110 is enlarged and shown in FIG. 11, adopts a structure that includes a first wall portion 111 vertically extending from the turntable 2 side toward the ceiling plate 11 and a second wall portion 112 vertically extending from the ceiling plate 11 toward the turntable 2 that are respectively formed along the circumferential direction and are formed alternately in the radial direction of the turntable 2. More specifically, the second wall portion 112, the first wall portion 111 and the second wall portion 112 are arranged in this order from the protrusion portion 5 toward the center area C. In this example, the second wall portion 112 on the protrusion portion 5 has a more expanded structure toward the protrusion portion 5 than the other wall portions 111, 112. As an example of respective sizes of the wall portions 111, 112, a distance j between the wall portions 111 and 112 is, for example, 1 mm, and a distance m between the wall portion 111 and the ceiling plate 11 (a gap between the wall portion 112 and the core portion 21) is, for example, 1 mm.

Accordingly, in the labyrinth structure 110, for example, because a Si-containing gas discharged from the first process gas nozzle 31 and heading for the center area C is needed to go over the wall portions 111, 112, the flow speed decreases as approaching the center area C and the gas becomes difficult to diffuse. Due to this, before the process gas reaches the center area C, the process gas is pushed back toward the process area P1 by the separation gas supplied to the center area C. In addition, the plasma generating gas such as NH$_3$ gas heading for the center area C also finds it difficult to reach the center area C. This prevents the process gases from mixing with each other in the center area C.

On the other hand, the N$_2$ gas supplied to the center area C from the upper side is likely to spread vigorously in the circumferential direction, but since the labyrinth structure 110 is provided, the flow speed is suppressed while the N$_2$ gas goes over the wall portions 111, 112 of the labyrinth structure 110. At this time, the N$_2$ gas is likely to intrude into the very narrow area such as between the rotation table 2 and the protruding portion 92, but since the flow speed is suppressed by the labyrinth structure 110, the N$_2$ gas flows out to a broader area (for example, the process area P1 or an area between the casings) than the narrow area. This prevents the N$_2$ gas from flowing into the lower side of the casing 90. Moreover, as described above, because an area below the casing 90 is set at higher pressure compared to the other areas in the vacuum chamber 1, the N$_2$ gas flowing into the area is suppressed.

As shown in FIG. 1, a heater unit 7 is provided in a space between the turntable 2 and the bottom portion 14. The wafer W on the turntable 2 can be heated to, for example, 300° C. through the turntable 2. In FIG. 1, a numeral 71*a* is a cover member provided on the lateral side of the heater unit 7, and numeral 7*a* is a cover member to cover the upper side of this heater unit 7. Furthermore, on the bottom portion 14 of the vacuum chamber 1, purge gas supplying tubes 73 to purge spaces in which the respective heater units 7 are arranged below the heater units 7 are provided at plural places through the circumferential direction.

As shown in FIGS. 2 and 3, the transfer opening 15 to transfer the wafer W between an external transfer arm (not shown in the drawing) and the turntable 2 is formed in the side wall of the vacuum chamber 1, and the transfer opening 15 is configured to be hermetically openable and closeable by a gate valve G. In addition, because the wafer W is transferred into or from the concave portions 24 at a position facing the transfer opening 15 with the transfer arm, lift pins for transfer to lift up the wafer W from the back side by penetrating through the concave portion 24 and the lifting mechanism (none of which are shown in the drawing) are provided at the position corresponding to the transfer position below the turntable 2.

Moreover, a control part 120 constituted of a computer to control operation of the whole apparatus is provided in this film deposition apparatus, and a program to implement a film deposition process and an alteration process that are described below is stored in a memory of the control part 120. This program is constituted of instructions of step groups to cause the apparatus to implement operations described below, and is installed from a memory unit 121 to be a storage medium such as a hard disk, a compact disc, a magnetic optical disc, a memory card and a flexible disc into the control part 120.

Figure 14:
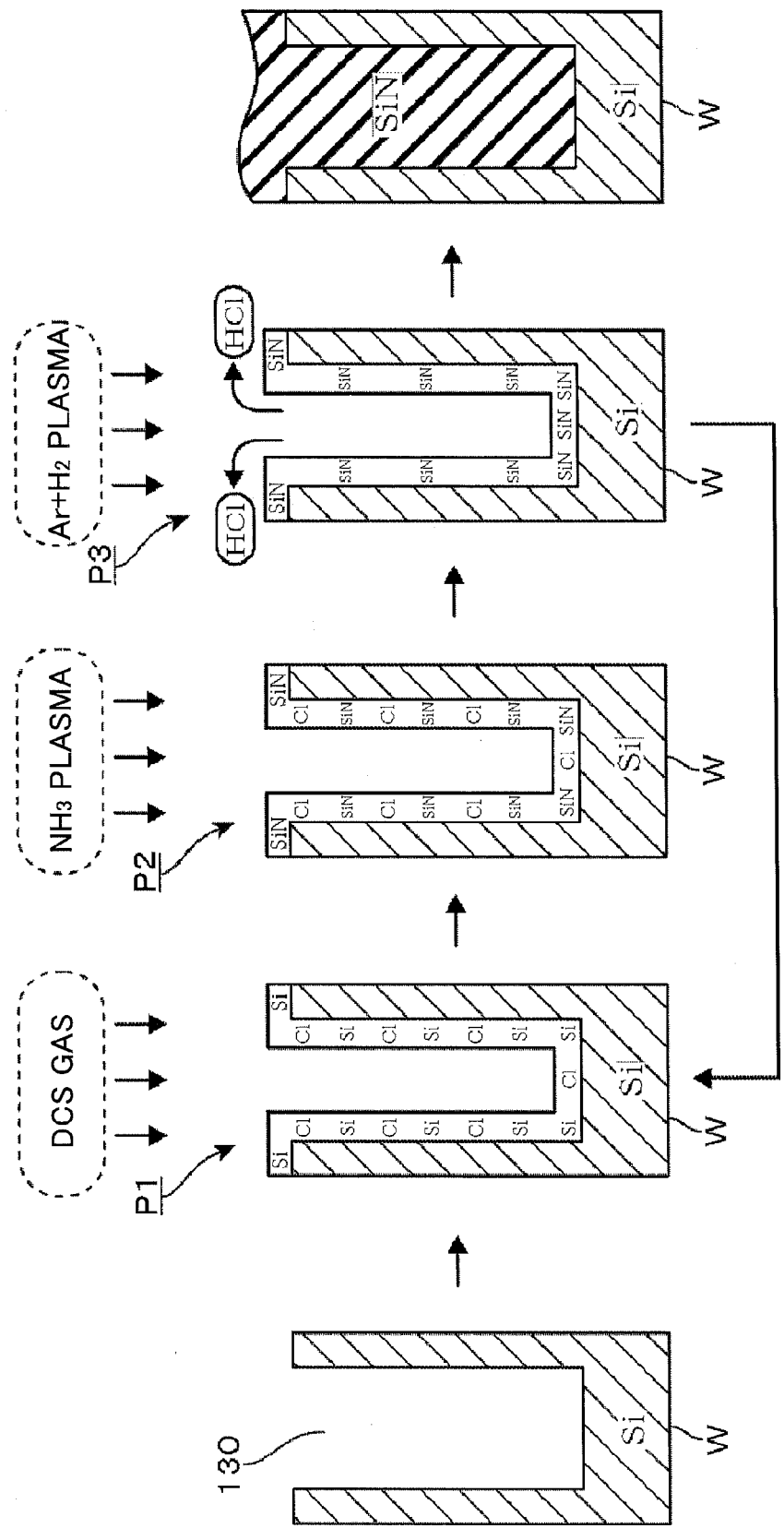
FIG. 14 is a schematic diagram showing a way of depositing a thin film on a substrate in the film deposition apparatus of the embodiment.

Next, a description is given about an action of the above-mentioned embodiment. First, the gate valve G is opened, and for example, five wafers W are loaded on the turntable 2 through the transfer opening 15 by the not shown transfer arm, while rotating the turntable 2 intermittently. An interconnection deposition process using a dry etching process, a CVD (Chemical Vapor Deposition) method or the like has already been performed on these wafers W. Hence, an electric interconnection structure is formed inside the wafer W. Furthermore, in the surface of the wafer W, as shown on the left edge of FIG. 14, a concave portion 130 such as a hole or groove is formed. Next, the gate valve G is closed; the inside of the vacuum chamber 1 is evacuated by the vacuum pump 64; and the wafer W is heated, for example, to 300° C. by the heater unit 7, while rotating the turntable 2 in a clockwise fashion. Here, FIG. 14 depicts a part of the wafer W schematically.

Subsequently, the process gas nozzle 31 discharges a Si-containing gas, and the main plasma generating gas nozzle 32 discharges an NH$_3$ gas. Moreover, the auxiliary plasma generating gas nozzle 34 discharges a mixed gas of an Ar gas and an H$_2$ gas. Furthermore, a separation gas is discharged from the separation gas nozzles 41, 42 at a predetermined flow rate, and an N$_2$ gas is discharged from a separation gas supplying tube 51 and the purge gas supplying tubes 72, 72 at a predetermined flow rate. Then, a pressure adjusting part 65 adjusts a pressure in the vacuum chamber 1 at a preliminarily set processing pressure, for example, in a range from 400 to 500 Pa, 500 Pa in this example. Moreover, in the main plasma generating part 81, radio frequency power is supplied to the respective antennas 83*a*, 83*b*, for example, so as to be 1500 W and 1000 W, respectively. In the auxiliary plasma generating part 82, the radio frequency power is supplied to the respective antennas 83a, 83b, for example, so as to be 1500 W and 1000 W, respectively.

At this time, for example, an $N_2$ gas that flows from the upstream in the rotational direction of the turntable 2 relative to the respective casings 90 toward the casings 90, by being induced by the rotation of the turntable 2, is likely to be disturbed by the casings 90. However, because the gas passage 101 is formed in the side ring 100 on the outer circumferential side of the casings 90, the above-mentioned gas flows around the casings 90 and then is evacuated through the gas passage 101.

On the other hand, a part of the gas flowing from the upstream side of the casing 90 toward the casing 90 is likely to enter the lower side of the casing 90. However, in the lower area of the casing 90, the protruding portion 92 is formed to cover the area, and the gas discharge nozzles 33 of the plasma generating gas nozzles 32, 34 respectively face obliquely downward on the upstream side in the rotational direction of the turntable 2. Accordingly, the plasma generating gas discharged from the plasma generating gas nozzles 32, 34 runs into the lower side of the protruding portion 92, and rejects the $N_2$ gas and the like flowing from the upstream outward of the casing 90. Then, the plasma generating gas discharged from the respective plasma generating gas nozzles 32, 34 is pushed back to the downstream side in the rotational direction of the turntable 2 by the protruding portion 92. At this time, the process areas P2, P3 below the casings 90 become a higher pressure by about 10 Pa, for example, compared to the pressure of the other area in the vacuum chamber 1. By doing this, the intrusion of the $N_2$ gas and the like into the lower side of the casings 90 can be prevented.

Then, the Si-containing gas is likely to intrude into the center area C, but since the labyrinth structure 110 is provided in the center area C, the gas flow is blocked by the labyrinth structure 110, and the Si-containing gas is pushed back to the original process area P1 by the separation gas. Moreover, respective gases attempting to intrude into the center area C are blocked similarly. Accordingly, the mixture of the process gases (i.e., plasma generating gases) in the center area C is prevented. Furthermore, the labyrinth structure 110 prevents the $N_2$ gas discharged from the center area C toward the outer circumferential side from intruding into the lower side of the casing 90.

Figure 12:
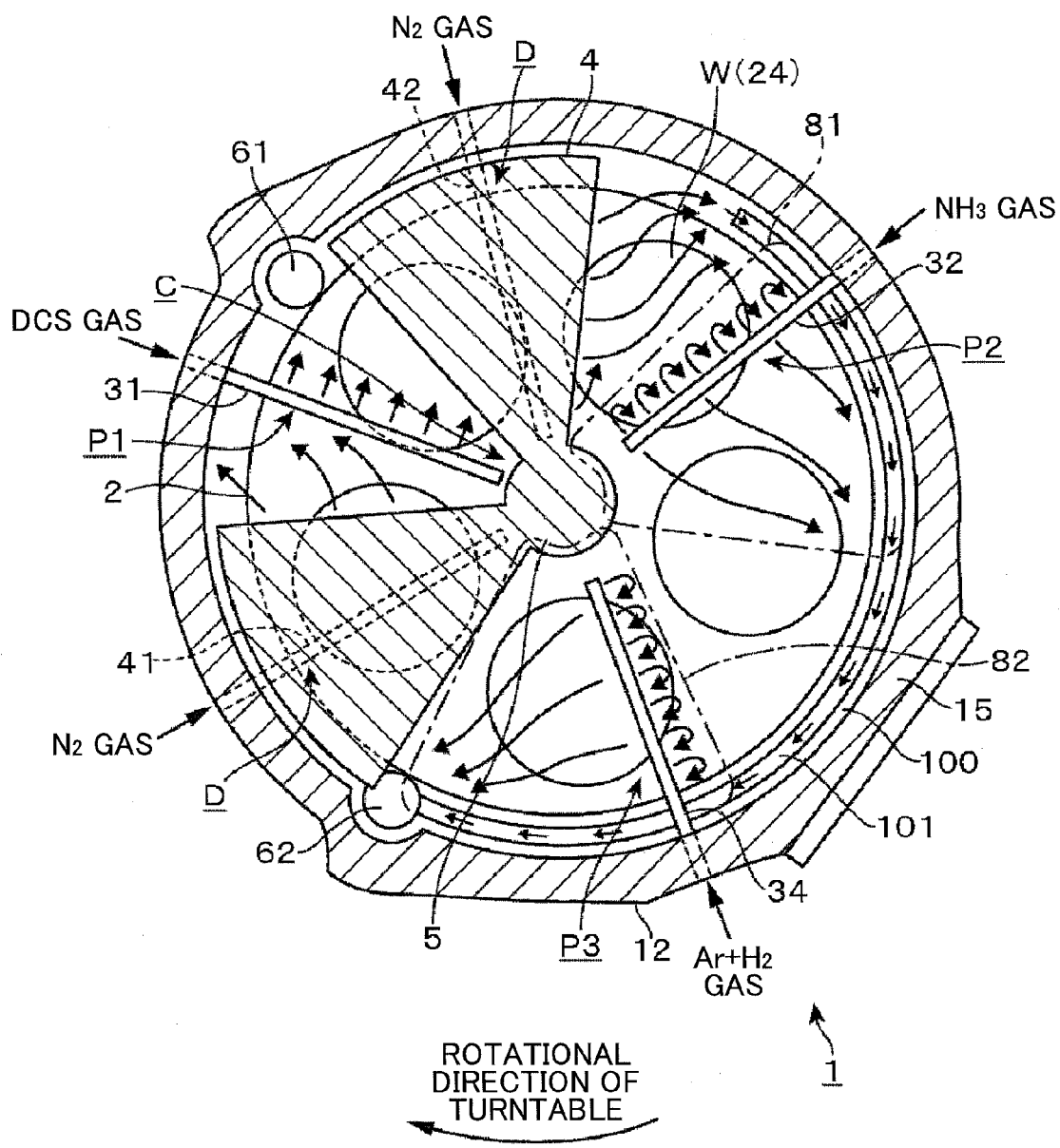
FIG. 12 is a schematic diagram showing a gas flow in the film deposition apparatus of the embodiment.

In addition, because the $N_2$ gas is supplied between the first process area P1 and the second process area P2, as shown in FIG. 12, the Si-containing gas and the plasma generating gases such as the $NH_3$ gas and the like are evacuated so as to not to mix with each other. Moreover, since the purge gas is supplied to the lower side of the turntable 2, the gas attempting to diffuse into the lower side of the turntable 2 is pushed back toward the evacuation openings 61, 62.

Figure 13:
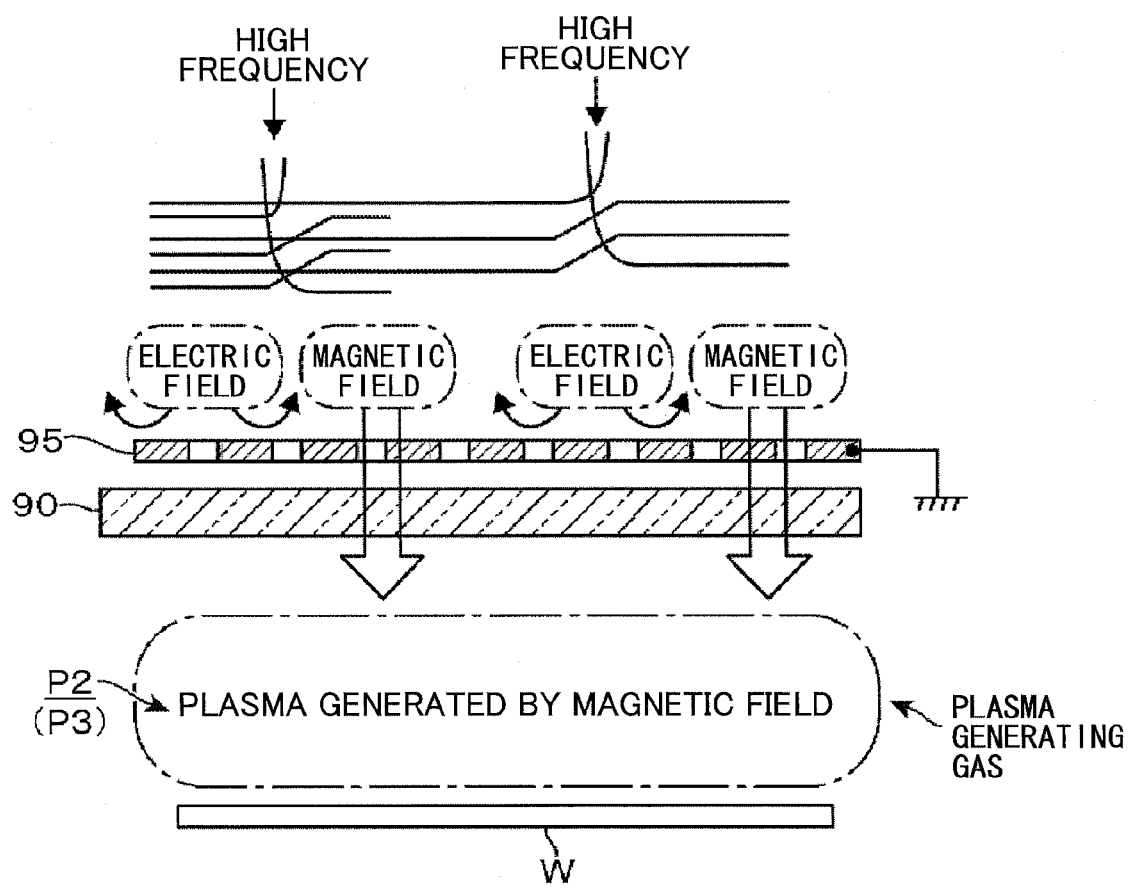
FIG. 13 is a schematic diagram showing a way of plasma generation in the film deposition apparatus of the embodiment.

At this time, as shown in FIG. 13 schematically, an electric field and a magnetic field occur in the respective plasma generating parts 81, 82 due to the radio frequency power supplied from the radio frequency power source 85. Because the Faraday shield 95 is provided as discussed above, the electric field among the electric field and the magnetic field is reflected or absorbed (diminished) by the Faraday shield 95, and is inhibited (blocked) to arrive into the vacuum chamber 1. Furthermore, since the conductive paths 97a, 97a are arranged at one end and the other end of the slits 97 in the length direction, respectively, the electric field likely to head for the wafer W side going around the one end and the other end is also blocked. On the other hand, because the slits 97 are formed in the Faraday shield 95, the magnetic field arrives in the vacuum chamber 1 through the lower surface of the casing 90. In addition, since the slots 97 are not formed in the Faraday shield 95 on the lateral side of the plasma generating parts 81, 82 along the circumferential direction, the electric field and the magnetic field do not go around to the lower side through the lateral side.

Therefore, the plasma generating gases discharged from the plasma generating gas nozzles 32, 34 are respectively activated by the magnetic field having passed through the slits 97, and plasma such as ions and radicals is generated. More specifically, the plasma of the $NH_3$ gas is generated in the second process area P2. Moreover, the plasma of the Ar gas and the $H_2$ gas is generated in the third process area P3. At this time, because the first antennas 83a and the second antennas 83b are provided in the radial direction of the turntable 2, an intensity of the plasma generated in the vacuum chamber 1 becomes greater in the outer circumference side than in the center portion side of the turntable 2. Here, FIGS. 4 and 8 show the antennas 83a, 83b schematically, and respective sizes of these antennas 83a, 83b, Faraday shields 95, casings 90, and wafers W are drawn exaggeratingly larger than the actual proportion.

In the meanwhile, the wafer W reaches the first process area P1 by the rotation of the turntable 2 and the Si-containing gas is adsorbed on the surface of the wafer W in the first process area P1. Next, in the second process area P2, the Si-containing gas having been adsorbed on the surface of the wafer W is azotized by the plasma of the $NH_3$ gas, and one or more molecular layers of a silicon nitride film (Si—N) to be a film component are formed, which finally forms a reaction product. At this time, impurities such as chlorine (Cl), organic substances and the like, which may originate, for example, from a residual radical contained in the Si-containing gas, may be contained in the silicon nitride firm.

Subsequently, a chemical alteration process of the silicon nitride film is performed when the plasma of the auxiliary plasma generating gas (Ar, $H_2$) contacts the surface of the wafer W by the rotation of the turntable 2. More specifically, for example, as shown in FIG. 14, collision of the plasma with the surface of the wafer W serves the impurities to be released from the silicon nitride film as an HCl gas and an organic gas, or densification (an increase in the density) of the silicon nitride firm to be achieved by allowing elements in the silicon nitride film to be rearranged.

At this time, by allowing the turntable 2 to rotate, since the circumferential speed is faster in the outer circumference side than in the center portion side, an effect of the plasma process (a degree of the nitriding process or the (chemical) alteration process) is likely to be smaller in the outer circumference side than in the center portion side. However, because the intensity of the plasma is higher in the outer circumference side than in the center portion side, a degree of the plasma process becomes uniform in the radial direction of the turntable 2. By continuing the rotation of the turntable 2 this way, as shown in FIG. 14, adsorption of the Si-containing gas to the surface of the wafer W, nitriding of the component of the Si-containing gas adsorbed on the surface of the wafer W and plasma alteration to the reaction product are carried out multiple times in this order, by which the reaction product is deposited and a thin film is formed so as to fill the above-mentioned concave portion 130. Here, as discussed above, though the electric interconnection structure is formed inside the wafer W, because the electric field is blocked by providing the Faraday shield 95 between the plasma generating parts 81, 82 and the wafer W, electric damage to the interconnection structure is suppressed.

According to the above embodiment, since the two plasma generating parts 81, 82 are provided away from each other in the rotational direction of the turntable 2, and the Faraday shields 95 are respectively provided between the plasma generating parts 81, 82 and the wafer W, the electric field generated by the plasma generating parts 81, 82 can be blocked. On the other hand, because the slits 97 extending in a direction perpendicular to the antennas 83 are provided in the Faraday shields 95, the magnetic field generated by the plasma generating parts 81, 82 can arrive in the vacuum chamber 1. Accordingly, the plasma process can be performed preventing the electric damage to the electric interconnection structure inside the wafer W. Therefore, a thin film having favorable film quality and electric property can be promptly obtained. Furthermore, since the two plasma generating parts 81, 82 are provided, the plasma processes different from each other can be combined. Hence, as discussed above, because different kinds of plasma processes such as the plasma nitriding process of the Si-containing gas having been adsorbed on the wafer W and the plasma alteration process of the reaction product can be combined, an apparatus with a high degree of flexibility can be obtained.

Moreover, since the Faraday shield 95 is provided, damage (i.e., etching) by the plasma to a quartz member such as the casing 90 can be suppressed. Due to this, long-life improvement of the quartz member is possible, and generation of contamination and even nonuniformity of a film thickness due to mingling of quartz ($SiO_2$) with the thin film (SiN) can be reduced.

Furthermore, since the casing 90 is provided, the plasma generating parts 81, 82 can be made closer to the wafer W on the turntable 2. Because of this, even in a high pressure environment with a degree of performing a film deposition process (i.e., a low degree of vacuum), a favorable alteration process can be carried out, reducing deactivation of the ions and the radicals in the plasma. In addition, since the protruding portion 92 is provided on the casing 90, the O-ring 11d is not exposed to the process areas P2, P3. This can prevent, for example, a fluorine system component contained in the O-ring 11d from mixing into the wafer W, and the long-life improvement of the O-ring 11d can be achieved.

Furthermore, the protruding portion 92 is formed on the lower surface of the casing 90, and the gas discharge ports 33 of the plasma generating gas nozzles 32, 34 are set to face upstream in the rotational direction of the turntable 2. Because of this, even if a gas flow rate discharged from the plasma generating gas nozzles 32, 34 is a low flow rate, intrusion of the $NH_3$ gas or the $N_2$ gas toward the lower area of the casing 90 can be inhibited. Therefore, in performing the plasma process with the film deposition process, for example, since an exhaust port or a pump is not needed to be individually provided in an area between the plasma generating parts 81, 82 or an area between the process area P1 and the main plasma generating part 81, and even the separation area D is not needed to be provided in the above-mentioned area, an apparatus configuration can be simplified.

In addition, in arranging the casings 90, as shown in FIG. 10, because the gas passage 101 is formed in the side ring 100 on the outer circumference side of the casings 90, the respective gases can be sufficiently evacuated, flowing around the casings 90.

Moreover, since the casings 90 hold the plasma generating parts 81, 82 inside, these plasma generating parts 81, 82 can be arranged in an atmosphere area (i.e., an outside area of the vacuum area 1), and therefore maintenance of the plasma generating parts 81, 82 becomes easier.

Here, because the plasma generating parts 81, 82 are put in the casings 90, for example, on the center area C side, the end of the plasma generating part 81 is distanced the same length as a thickness of the side wall of the casings 90 from the rotation center of the turntable 2. This makes the plasma reach the ends of the wafers W on the center area C side. On the other hand, if the casings 90 are formed to extend to a location close to the center area C side so that the plasma reaches the ends of the wafers W, as discussed above, the center area C becomes narrow. In this case, unfortunately, the Si-containing gas may mix with the $NH_3$ gas and the like in the center area C. However, in the embodiment of the present invention, the gas passage is made longer by forming the labyrinth structure 110 in the center area C, which makes it possible to prevent the Si-containing gas from mixing with the $NH_3$ gas and the like in the center area C, and the $N_2$ gas from entering the plasma area, ensuring the broad plasma area across the radial direction of the turntable 2.

Furthermore, because the degree of alteration of the wafers W in the radial direction of the turntable 2 is uniform, a thin film having a uniform film quality may be obtained across the surface.

In the above-mentioned examples, though the deposition of the reaction product and the alteration process of the reaction product are performed alternately, after the reaction products are deposited, for example, about 70 layers (i.e., about 10 nm in film thickness), the alteration process may be performed for the deposition of these reaction products in a layer-by-layer manner. More specifically, supplying the radio frequency power to the plasma generating part 82 is stopped while the film deposition process of the reaction products is carried out by supplying the plasma of the Si-containing gas and the $NH_3$ gas. Then, after forming the layered product, supplying these Si-containing gas and $NH_3$ gas is stopped, and the radio frequency power is supplied to the plasma generating part 82. In such a case of what is called batch alteration, effects similar to the above-mentioned examples can be obtained.

In the above examples, an example of performing the plasma process (i.e., nitriding process) for generating the reaction product (Si—N) and the plasma alteration process in the two plasma generating parts 81, 82 respectively is taken, but for example, in the main plasma generating part 81, a plasma etching process may be performed as well as the plasma process for generating the reaction product. In such a example of performing the plasma etching process, a description is given about configurations of a film deposition apparatus and a wafer W hereinafter.

Figure 15:
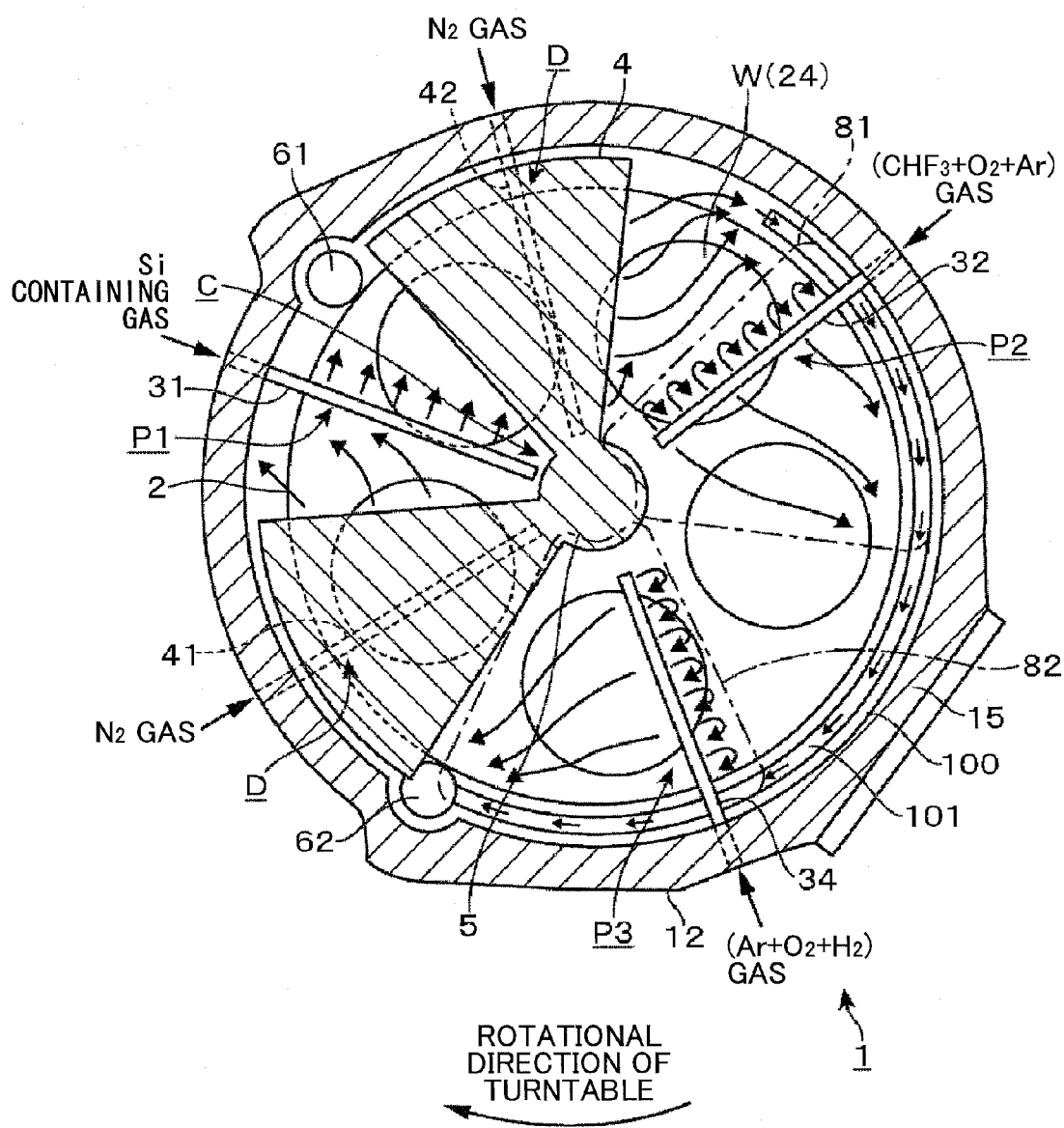
FIG. 15 is a cross-sectional plan view showing another example of a film deposition apparatus of an embodiment.

To begin with, a description is given about the film deposition apparatus. As shown in FIG. 15, a first process gas nozzle 31 of this film deposition apparatus is connected to a retention source, for example, of a BTBAS (bistertiary-butylaminosilane: $SiH_2(NH-C(CH_3)_3)_2$) gas as a first process gas. The main plasma generating gas nozzle 32 is connected to retention sources of an etching gas including C (carbon) and F (fluorine) such as $CHF_3$ gas, an $O_2$ gas to be a second process gas, and an Ar gas to be the main plasma generating gas. More specifically, the upstream side of the main plasma generating gas nozzle 32, a drawing of which is omitted, divides into, for example, three branch pipes, and the respective pipes are individually connected to the retention sources of the respective gases. The auxiliary plasma generating gas nozzle 34 is connected to retention sources of an $O_2$ gas, an Ar gas and a $H_2$ gas as auxiliary plasma generating gases.

Next, a description is given about a configuration of the wafer W. As shown in the left side of FIG. 16, a concave portion 130 is formed in the wafer W as well as the above-mentioned examples, and the concave portion 130 is formed into a reverse taper shape whose opening size decreases from the lower end to the upper end. Here, FIG. 16 depicts a part of the wafer W schematically, where the reverse shape of the concave portion is exaggerated.

Figure 16:
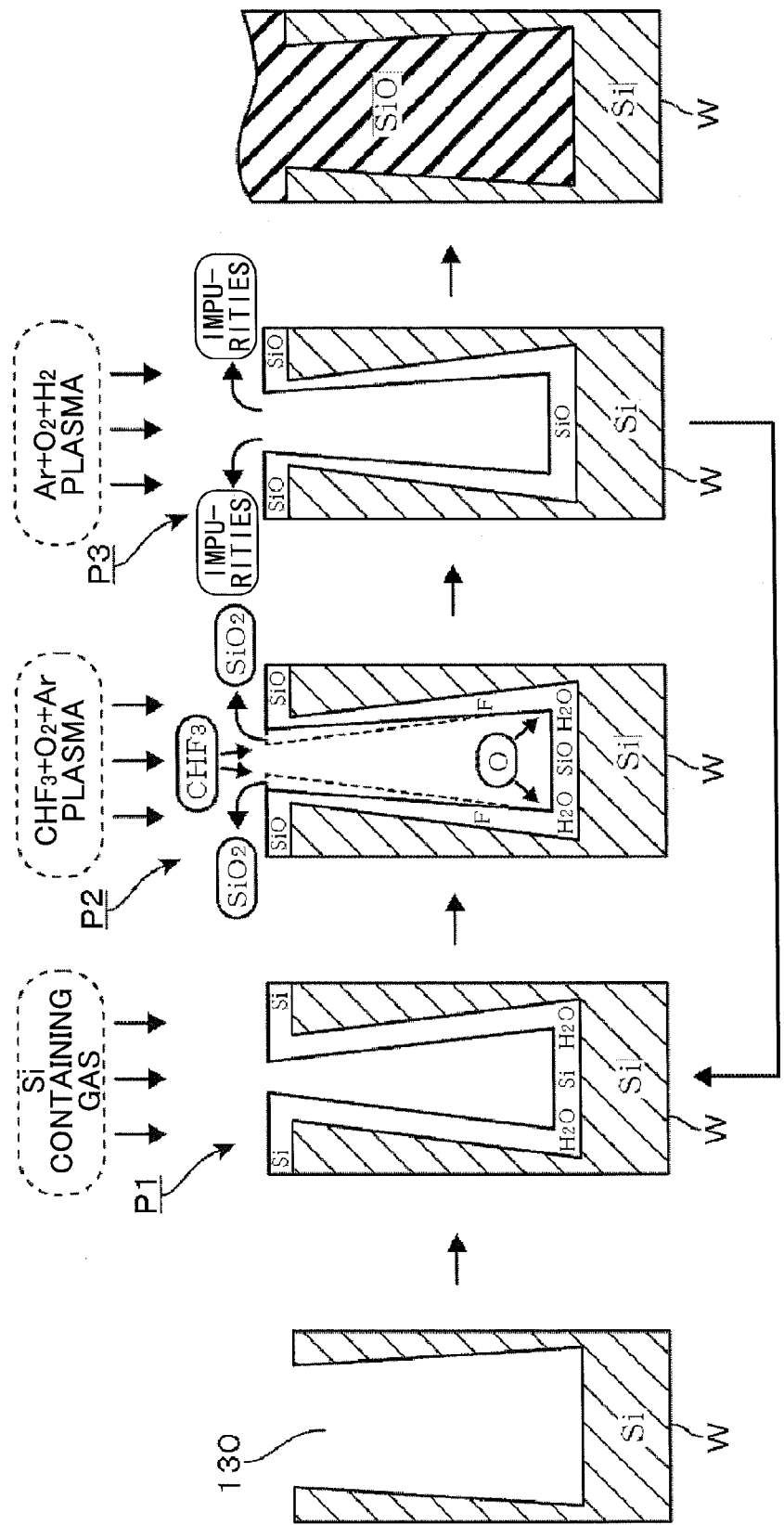
FIG. 16 is a schematic diagram showing a way of depositing a thin film on a substrate in the film deposition apparatus of the other example of the embodiment.

When a film deposition process is performed on this wafer W similarly to the above mentioned examples by using the film deposition apparatus in FIG. 15, as shown in the second from the left in FIG. 16, a component of the BTBAS gas adsorbs on the surface of the wafer W including the inside of the concave portion 30 in the first process area P1. Then, in the second process area P2, the Ar gas is converted into plasma by a magnetic field of the antenna 83, and the above-mentioned etching gas and the $O_2$ gas are respectively converted into plasma by this plasma of the Ar gas. For example, the plasma of the $O_2$ gas (i.e., radical ions) among these plasmas of the etching gas and the $O_2$ gas, diffuses from an area on the upper side of the wafer W across to an area on the lower end portion in the concave portion 130, and oxidizes the component of the BTBAS gas in these areas, which generates a reaction product (i.e., silicon oxidation product).

On the other hand, because the plasma of the etching gas has a shorter life than that of the plasma of the $O_2$ gas (radical), the plasma of the etching gas cannot diffuse to the lower end portion in the concave portion 130, keeping the activated state, and therefore contacts the upper side of the wafer W and the vicinity of the upper end portion. When the wafer W is contacted with the plasma of the etching gas, as shown in the center of FIG. 16, the reaction product on the wafer W is etched, and for example, is evacuated as a gas with an unreacted process gas and a gas of a by-product. Accordingly, because the reaction product deposited on the inside of the concave portion 130 becomes thinner on the upper end side than on the lower end side, in a sense, the degree of the reverse taper of the concave portion 130 is slightly reduced, and the inner wall of the concave portion 130 becomes more vertical. At this time, sometimes the reaction product on the wafer W may contain impurities contained in the first process gas or the etching gas (e.g., water or fluorine).

Next, in the third process area P3, as shown in the second from the right of FIG. 16, the alteration process is performed by removing the impurities from the reaction product formed on the wafer W as a gas such as a HF gas. Then, by the rotation of the turntable 2, when such adsorption of the BTBAS gas, oxidizing and etching of the BTBAS gas, and alteration process of the reaction product are repeated plural times, the reaction product is subsequently deposited in the concave portion 130, allowing the impurities to be removed (reduced), while the reverse taper shape of the concave portion 130 becomes more orthogonal, or the reverse taper shape becomes a more tapered shape (i.e., the opening size of the upper end portion is larger than that of the lower end portion). Hence, when the deposition of the thin film onto the inside of the concave portion 130 is completed, as shown in the right of FIG. 16, the thin film is obtained as having no vacant space such as void in the concave portion 130, and very low concentration of impurities in the etching gas as well as in the BTBAS gas.

Here, for example, if a thin film is attempted to be deposited into the concave portion 130 of the reverse taper shape by a normal CVD method, when the reaction product is deposited along the shape of the concave portion in a layer-by layer manner, the upper end of the concave portion 130 may be closed before the inside of the concave portion 130 is filled with the thin film. In this case, since a void is formed in the concave portion 130, for example, a resistance of a device becomes higher than a designed value. On the other hand, if the plasma etching is combined with such a CVD method, more specifically, if a film deposition process by the CVD method and a plasma etching process on the upper end side in the concave portion 130 are repeated and the film is deposited into the concave portion 130, for example, F (fluorine) may be mixed into the thin film as the impurities in the plasma etching process. Because of this, even if an anneal process is carried out after filling the concave portion 130 with the thin film, the impurities having entered the inside of the concave portion 130 are difficult to remove, and therefore, for example, an electric characteristic as designed cannot be obtained.

Accordingly, in the embodiment of the present invention, by performing the reaction product formation process, the plasma etching process, and the alteration process plural times in this order, the etching process is executed every time the reaction product is formed, and the impurities incorporated into the reaction product in the reaction product formation process and the etching process are removed. This makes it possible to form a thin film with a very low-impurity concentration across a film thickness direction, and to inhibit a vacant space such as a void from occurring in the concave portion 130 because the etching is performed to reduce the reverse taper shape of the concave portion 130 (become more vertical).

Here, since the gas supplied from the auxiliary plasma generating gas nozzle 32 contains an $O_2$ gas, the generation (i.e., oxidation of the BTBAS gas on the wafer W) and the alteration of the reaction product may be carried out in the third process area P3 without supplying the $O_2$ gas from the main plasma generating gas nozzle 32. In this case, in the second process area P2, the plasma etching process is performed by using an etching gas that etches Si such as Br (bromine), instead of the etching gas constituted of the above-mentioned $CHF_3$ gas, or with this etching gas. Moreover, when only the plasma etching process and only the plasma alteration process are carried out in the second process area P2 and the third process area P3 respectively, it is possible to provide a third plasma generating part (not shown in the drawing) between the second process area P2 and the third process area P3, and to perform the oxidation process of the BTBAS gas in the third plasma generating part.

Furthermore, in the above-mentioned film deposition apparatus, different kinds of plasma processes are performed in the respective plasma generating parts 81, 82, but the same kind of plasma process may be performed in the respective plasma generating parts 81, 82 to each other. More specifically, when the silicon oxidized film is deposited, supplying the $O_2$ gas and the Ar gas from the plasma generating gas nozzles 32, 34 respectively, and oxidizing the BTBAS gas and removing the impurities contained in the reaction product in the process areas P2, P3 respectively are possible.

Figure 17:
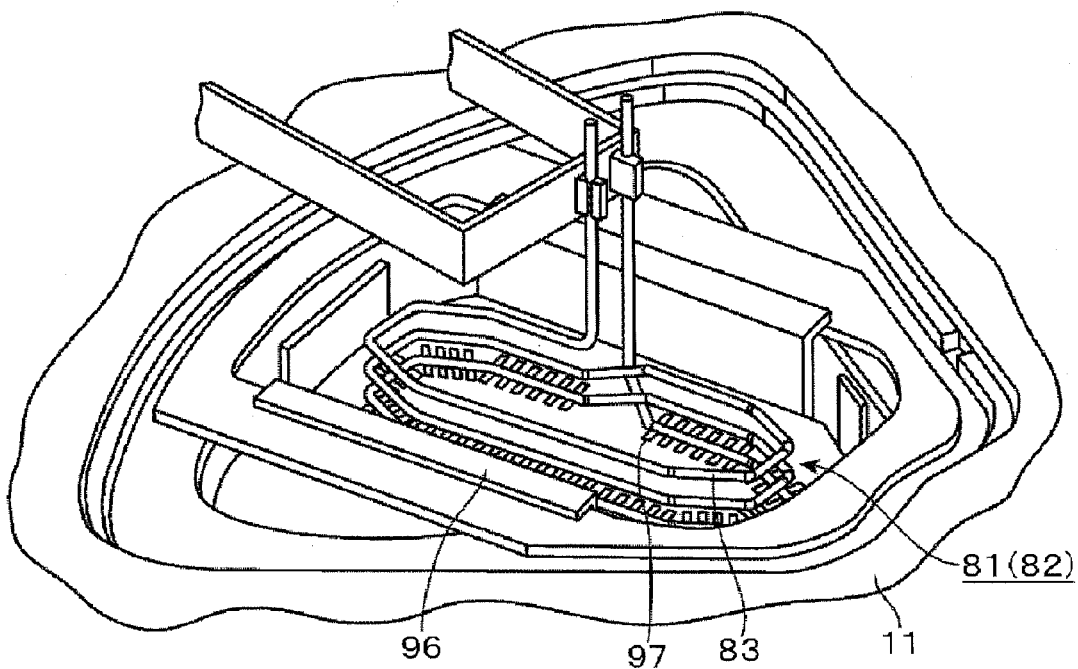
FIG. 17 is a perspective view showing a part of still another example of a film deposition apparatus of an embodiment.

Subsequently, other examples of the plasma generating parts 81, 82 in the above-described film deposition apparatus are cited. The following other examples may be applied to one or both of the plasma generating parts 81, 82. FIGS. 17 and 18 show an example of only the antenna 83 being provided, the antenna 83 being arranged to be an approximate rectangle (approximately an octagon more exactly) seen from the top. In this example also, the slit 97 is formed to have a width d that broadens from an area close to the opening 98 to an area away from the opening 98, which is not shown in the drawing.

Figure 18:
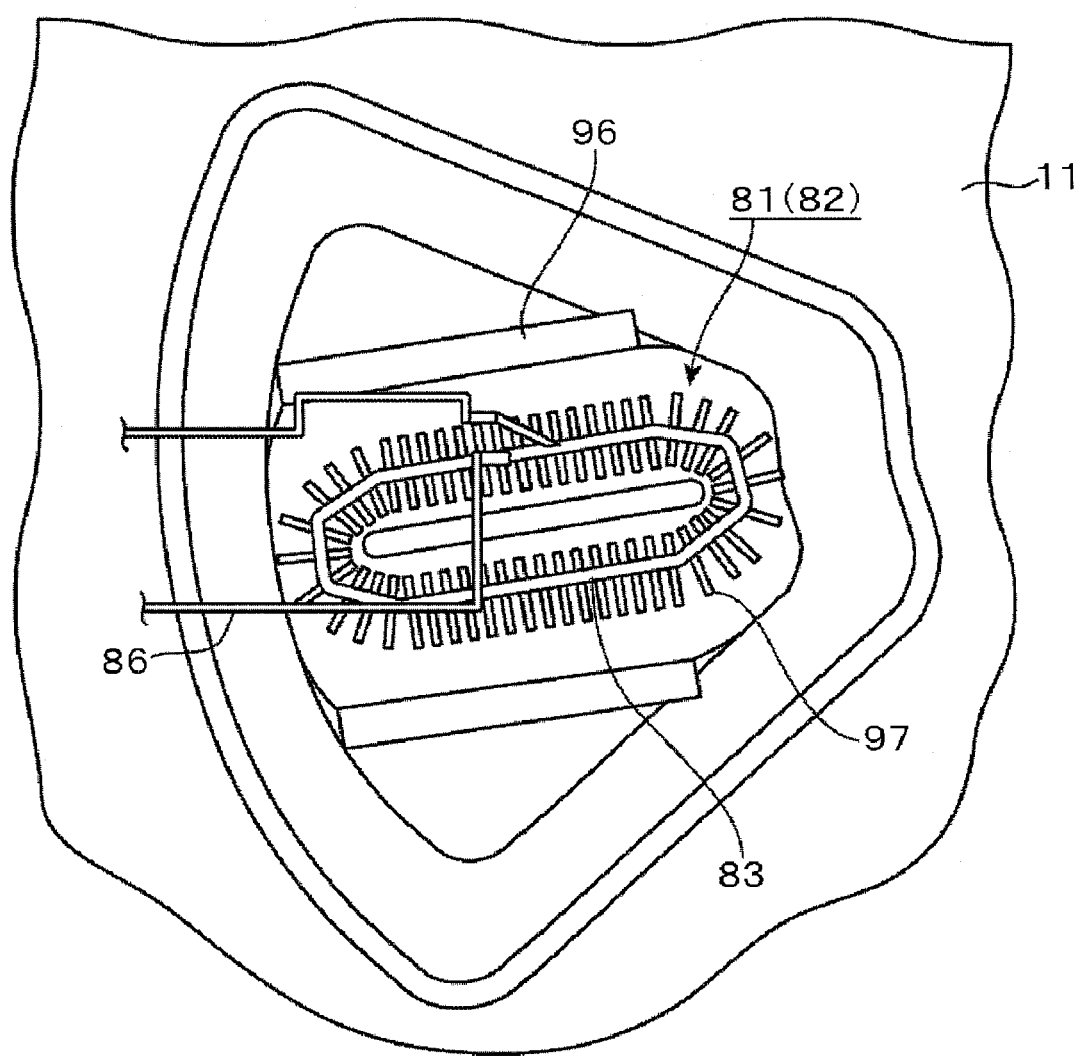
FIG. 18 is a plan view showing a part of the film deposition apparatus of the still other example of the embodiment.
Figure 19:
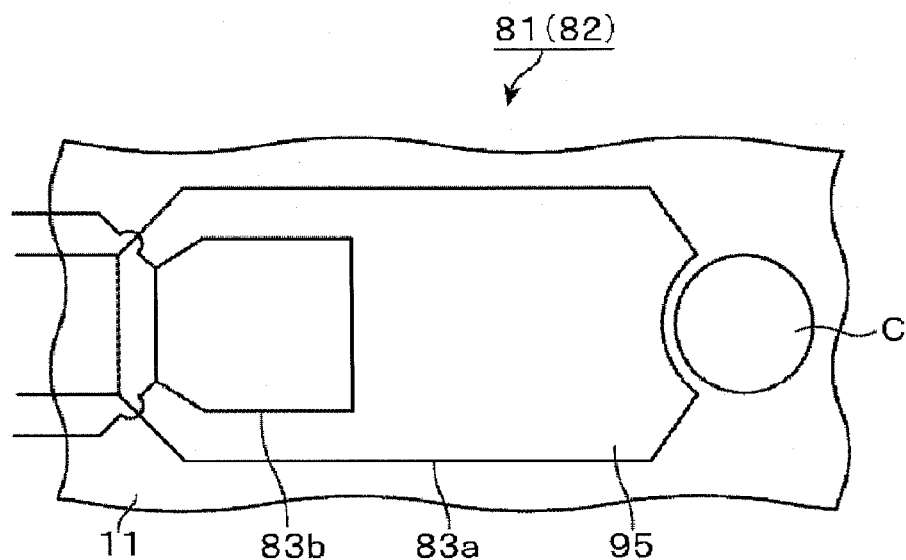
FIG. 19 is a plan view showing a part of a film deposition apparatus of another example of an embodiment.

In FIG. 19, two antennas 83a, 83b are arranged to be approximate rectangles as shown in FIGS. 17 and 18, a first antenna 83a is formed along the radial direction of the turntable 2, and a second antenna 83b is arranged on the outer circumference side of the turntable 2. Here, FIG. 19 shows a state of the ceiling plate 11 seen from the upper side, and the antennas 83a, 83b are depicted schematically. This point is similar in the following explanation of FIG. 20.

Figure 20:
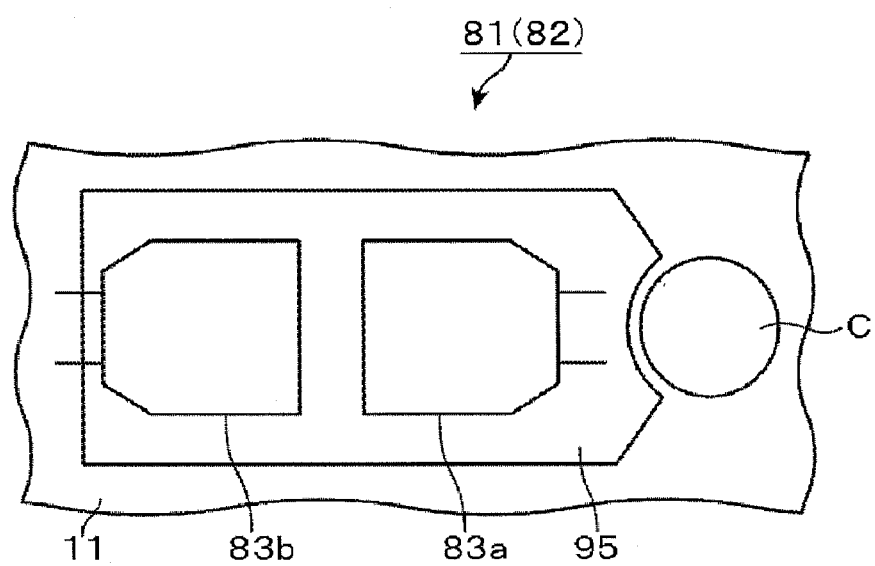
FIG. 20 is a plan view showing a part of a film deposition apparatus of another example of an embodiment.

FIG. 20 shows an example of two antennas 83a, 83b arranged to be approximate rectangles as shown in FIGS. 17 and 18, the first antenna 83a being arranged on the inner side in a radial direction of the turntable 2, the second antenna 83b being arranged on the outer side in the radial direction. In this example, the antennas 83a, 83b are respectively wound around so as to have the same area as each other.

Figure 21:
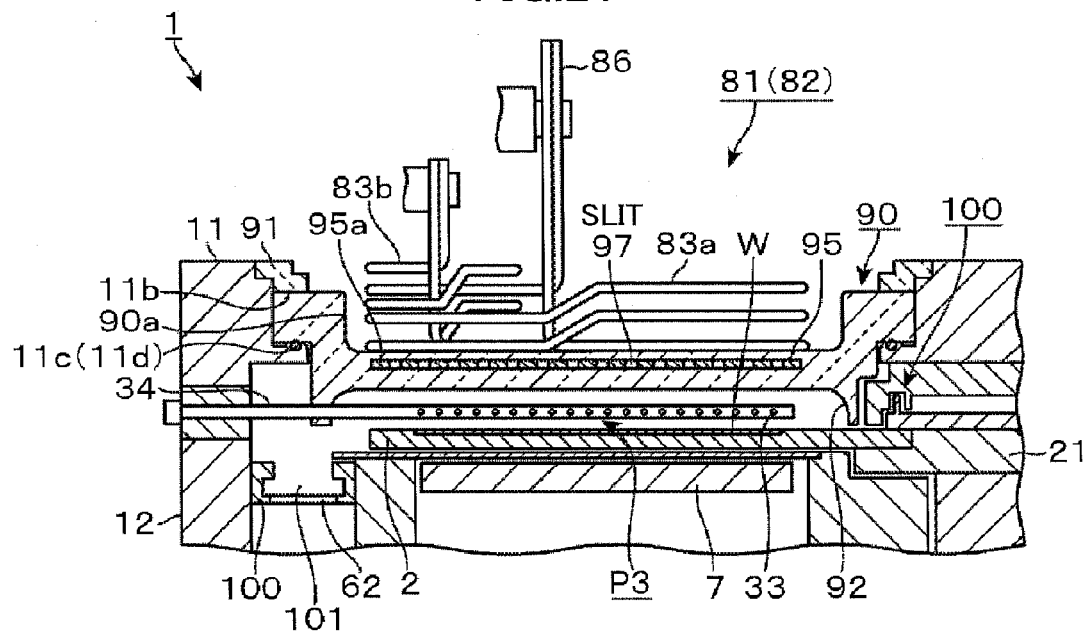
FIG. 21 is a vertical cross-sectional view showing a part of a film deposition apparatus of another example of an embodiment.

FIG. 21 shows an example of the Faraday shield 95 buried inside the casing 90. More specifically, the casing 90 below the plasma generating part 81 (82) is configured to include an upper end surface that is detachable, and to be able to hold the Faraday shield 95 in a portion where the upper end surface is detached. In other words, the Faraday shield 95 may be provided between the plasma generating part 81 (82) and the wafer W.

Figure 22:
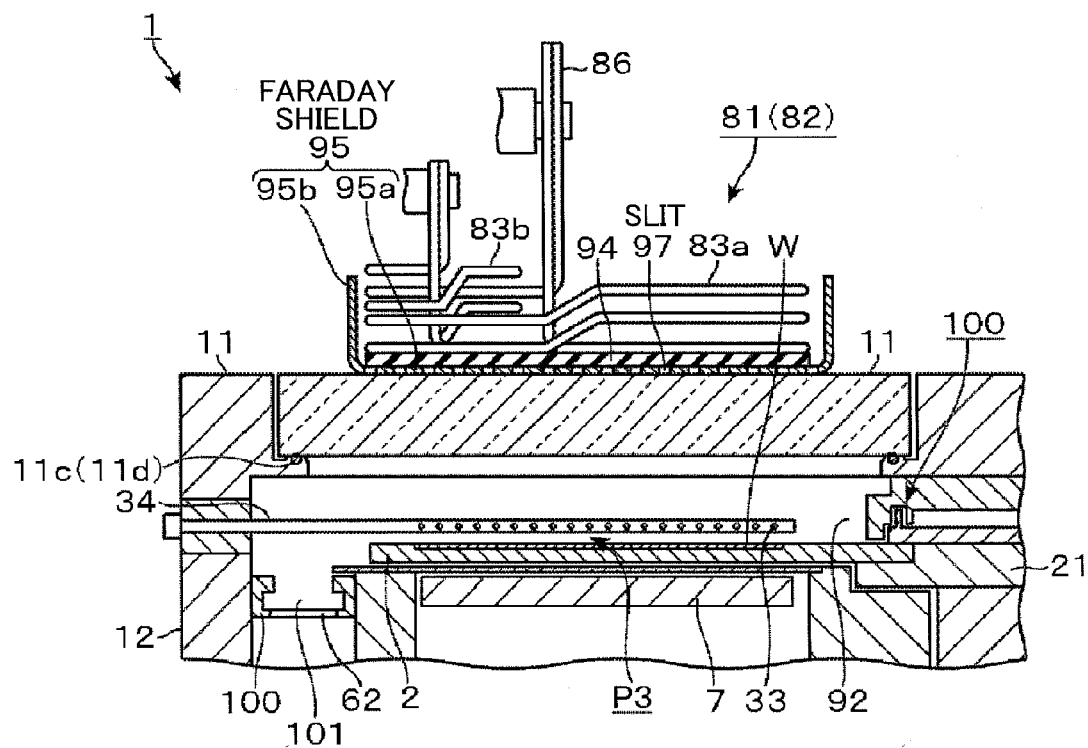
FIG. 22 is a vertical cross-sectional view showing a part of a film deposition apparatus of another example of an embodiment.

FIG. 22 shows an example of the plasma generating part 81 (82) and the Faraday shield 95 arranged on the upper side of the ceiling plate 11, instead of holding the plasma generating part 81 (82) and the Faraday shield 95 inside the casing 90. In this example, the ceiling plate 11 under the plasma generating part 81 (82) is configured to be made, for example, of a dielectric material such as quartz and the like, as a different member from the ceiling plate 11 in the other portions, and the lower outer circumference portion is hermetically connected to the ceiling plate 11 in the other portions by the O-ring 11d along the circumferential direction as discussed above.

Figure 23:
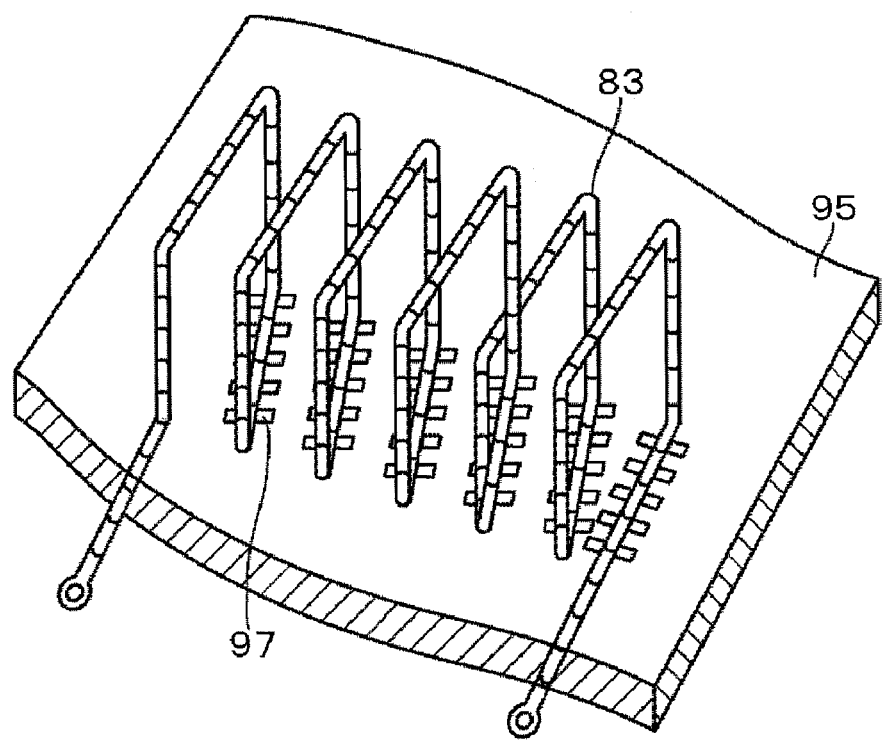
FIG. 23 is a perspective view showing a part of a film deposition apparatus of another example of an embodiment.

FIG. 23 shows an example of an antenna 83 winding around the horizontal axis direction instead of winding the antenna 83 around the vertical axis. More specifically, this antenna 83 is wound around an axis that extends along the rotational direction of the turntable 2 in an arc-like shape. Here in FIG. 23, components other than antenna 83 and the Faraday shield 95 are omitted.

Here, the antenna 83 is arranged in an area sectioned hermetically from an inner area of the vacuum chamber 1 (inside the casing 90 or on the ceiling plate 11), but the antenna 83 may be arranged in the inner area of the vacuum chamber 1. More specifically, for example, the antenna 83 may be arranged slightly below the lower surface of the ceiling plate 11. In this case, to prevent the antenna 83 from being etched by the plasma, the surface of the antenna 83 is coated with a dielectric material such as quartz and the like. Moreover, in this case, the surface of the Faraday shield 95 is similarly coated with a dielectric material such as quartz and the like between the antenna 83 and the wafer W so as to prevent the Faraday shield 95 from being etched by the plasma. Furthermore, the antenna 83 may be configured to allow the base end side to be inserted, for example, from the outer side of the vacuum chamber 1 into the vacuum chamber 1 hermetically, and the other end side to linearly extend toward the center area C, other than the configuration of winding in a coiled form.

Figure 24:
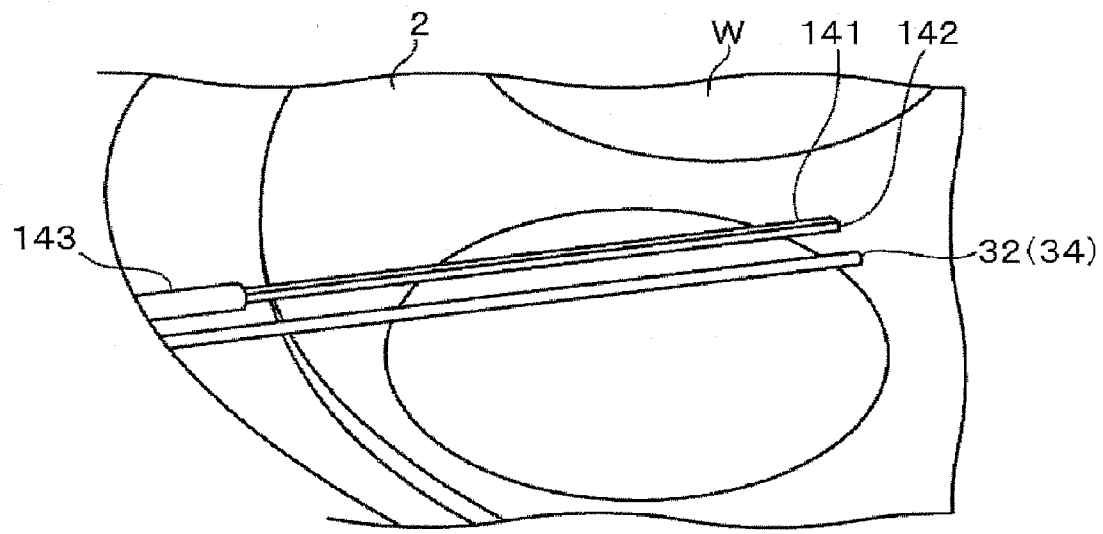
FIG. 24 is a perspective view showing a part of a film deposition apparatus of still another example of an embodiment.
Figure 25:
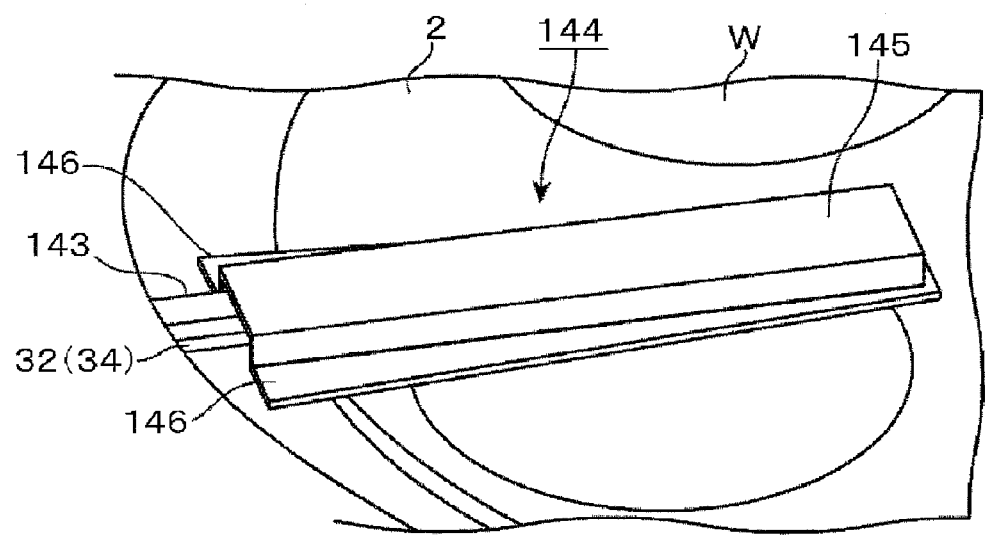
FIG. 25 is a perspective view showing a part of the film deposition apparatus of the still other example of the embodiment.
Figure 26:
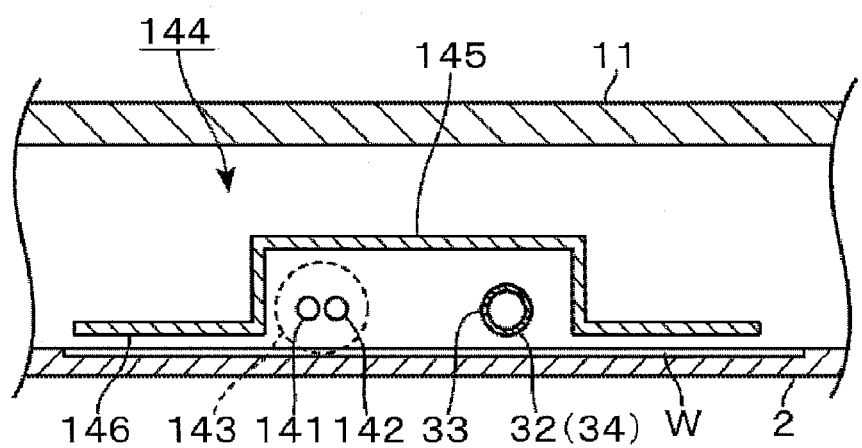
FIG. 26 is a vertical cross-sectional view showing a part of the film deposition apparatus of the still other example of the embodiment

In addition, in the above-mentioned respective examples, the plasma generating part 81 (82) generates inductivity coupled plasma (ICP) by using the wound antenna 83, but one of the plasma generating parts 81, 82, may generate capacitively coupled plasma (CCP). More specifically, as shown in FIGS. 24 through 26, a pair of electrodes 141, 142 is provided on the downstream side in the rotational direction of the turntable 2 relative to the plasma generating gas nozzle 32 (34), and these electrodes 141, 142 are hermetically inserted from the side wall of the vacuum chamber 1 through the supporting portion 143. Moreover, the electrodes 141, 142 are connected to the matching box 84 and the radio frequency power source 85 through the supporting portion 143. Here, a protective film such as quartz and the like is formed on surfaces of the electrodes 141, 142 to protect the electrodes 141, 142 from the plasma.

An approximately hat-shaped cover member 144 is provided above these electrodes 141, 142 and the plasma generating gas nozzle 32 (34) to prevent the $N_2$ gas and the like from flowing into a plasma generating area (i.e., the process area P2 (P3)). The cover member 144 is configured to be a box shape so as to cover the electrodes 141, 142 and the plasma generating gas nozzle 32 (34). The cover member 144 includes a cover body whose lower side is open, and an airflow regulation surface 146 that horizontally extends from the upstream side and the downstream side in the rotational direction of the turntable 2, and from the lower end surface of the center area C, respectively. FIG. 24 shows a state of the cover member 144 being detached, and FIG. 25 shows a state of the cover member 144 being attached.

In such a plasma generating part 81 (82), the plasma process is performed by converting the plasma generating gas into the plasma between the electrodes 141 and 142, allowing the airflow regulation surface 146 to suppress the gas from entering the process area P2 (P3).

In the above-mentioned respective examples, as a material that constitutes the Faraday shield 95, a low relative magnetic permeability material as low as possible is preferable so as to transmit the magnetic field. More specifically, silver (Ag), aluminum (Al) and the like are available. Moreover, with respect to the number of the slits 97 of the Faraday shield 95, for example, approximately 100 to 500 slits for a 1 m length of the antenna 83 are preferable because the magnetic field that comes into the vacuum chamber 1 becomes low if the number of the slits 97 of the Faraday shield 95 is too few, and the Faraday shield 95 becomes difficult to make if the number of the slits 97 is too many. Furthermore, the gas discharge ports 33 of the plasma generating gas nozzle 34 are formed to face the upstream side in the rotational direction of the turntable 2, but the gas discharge ports 33 may be formed to face the lower side or the downstream side.

As a material of the casings 90, a plasma etching resistance material such as alumina ($Al_2O_3$), yttria and the like may be used instead of quartz, and for example, these plasma etching resistance materials are coated with a surface of Pyrex glass (heat resistance glass of Corning Incorporated, Trademark) and the like. In other words, the casings 90 may be made of a material (dielectric material) that has a high plasma resistance and transmits a magnetic field.

In addition, the Faraday shield 95 is isolated from the antenna 83 by arranging the insulating plate 94 on the upper side of the Faraday shield 95 in the above-mentioned examples, but for example, the antenna may be coated with an insulating material such as quartz without arranging the insulating plate 94.

In this manner, according to embodiments of the present invention, a main plasma generating part and an auxiliary plasma generating part provided apart from each other in a circumferential direction of a turntable perform respective plasma processes on a substrate by supplying the first process gas and the second process gas onto the substrate in order, while rotating the turntable in the vacuum chamber. Then, an antenna for converting a main plasma generating gas to plasma by inductive coupling is provided in the main plasma generating part, and a Faraday shield in which slits extend in directions perpendicular to the antenna, is arranged between the antenna and the substrate. This makes it possible to prevent an electric field component of an electromagnetic field generated by the antenna from reaching the inside of a vacuum chamber, and by contrast, to pass the magnetic field toward the substrate side, which can reduce electric damage to the substrate by the plasma. Moreover, because the main plasma generating part and the auxiliary plasma generating part can perform different kinds of plasma processes from each other, a film deposition apparatus can be configured to have a high degree of flexibility regarding a process on the substrate.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A film deposition apparatus configured to perform a film deposition process by performing a cycle of supplying a first process gas and a second process gas in order plural times in a vacuum chamber, the film deposition apparatus comprising:
   a turntable having a substrate mounting area formed on a surface thereof to mount a substrate thereon, the turntable being configured to make the substrate mounting area revolve in the vacuum chamber;
   a ceiling plate forming a top face of the vacuum chamber, the ceiling plate having an opening having a length smaller than a diameter of the turntable in a radial direction of the turntable, the opening having an approximately fan-like shape in a planar view;
   a first plasma gas supplying part configured to supply a first plasma generating gas into the vacuum chamber;
   a second plasma gas supplying part configured to supply a second plasma generating gas into the vacuum chamber;
   a first plasma generating part configured to convert the first plasma generating gas to a first plasma, the first plasma generating part including an antenna facing the surface of the turntable and being configured so as to convert the first plasma generating gas to the first plasma by inductive coupling;
   a casing set in the opening of the ceiling plate and having a bottom supporting the antenna so as to arrange a lower end of the antenna at a position lower than the top face of the vacuum chamber, the bottom having a fan-like planar shape along the opening, the casing having a side wall provided along an outer edge of the bottom and protruding downward from the bottom up to a location that is higher than the surface of the turntable so as to substantially surround an area under the bottom; and
   a second plasma generating part provided away from the first plasma generating part in a circumferential direction and configured to convert the second plasma generating gas to a second plasma;
   wherein a grounded Faraday shield having a conductive plate-like body is provided so as to intervene between the antenna and an area where a plasma process is performed, and includes plural slits respectively extending in directions perpendicular to the antenna and arranged along an antenna extending direction to prevent an electric field component of an electromagnetic field generated around the antenna from passing toward the substrate and to pass a magnetic field toward the substrate.

2. The film deposition apparatus as claimed in claim 1, wherein the first plasma generating part and the second plasma generating part are to perform different kinds of plasma processes from each other.

3. The film deposition apparatus as claimed in claim 1, wherein the second plasma generating part includes a second antenna provided facing a surface of the turntable configured so as to convert the second plasma generating gas to the second plasma by inductive coupling in the vacuum chamber; and
   a grounded second Faraday shield having a conductive plate-like body is provided so as to intervene between the second antenna and an area where a second plasma process is performed, and includes plural slits respectively extending in directions perpendicular to the second antenna and arranged along a second antenna extending direction to prevent a second electric field component of a second electromagnetic field generated around the second antenna from passing toward the substrate and to pass a second magnetic field toward the substrate.

4. The film deposition apparatus as claimed in claim 1, wherein the first plasma generating part is to perform the plasma process of etching a reaction product generated on the substrate, and
   the second plasma generating part is to enhance the reaction product generated on the substrate by a reaction of the first process gas and the second process gas.

5. The film deposition apparatus as claimed in claim 1, wherein the antenna and the Faraday shield are hermetically separated from the area where the plasma process is performed by a dielectric material.

* * * * *